United States Patent
Onozawa et al.

(10) Patent No.: US 10,158,011 B2
(45) Date of Patent: Dec. 18, 2018

(54) SEMICONDUCTOR DEVICE

(71) Applicant: FUJI ELECTRIC CO., LTD., Kawasaki-shi (JP)

(72) Inventors: Yuichi Onozawa, Matsumoto (JP); Takahiro Tamura, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 19 days.

(21) Appl. No.: 15/071,187

(22) Filed: Mar. 15, 2016

(65) Prior Publication Data
US 2016/0197171 A1    Jul. 7, 2016

Related U.S. Application Data

(63) Continuation of application No. PCT/JP2015/053492, filed on Feb. 9, 2015.

(30) Foreign Application Priority Data

Mar. 19, 2014   (JP) ................... 2014-056610

(51) Int. Cl.
| | |
|---|---|
| *H01L 29/739* | (2006.01) |
| *H01L 29/423* | (2006.01) |
| *H01L 29/08* | (2006.01) |
| *H01L 29/10* | (2006.01) |

(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ........... H01L 29/1095; H01L 29/4236; H01L 29/42376; H01L 29/4238; H01L 29/66348; H01L 29/7813; H01L 29/7397; H01L 2924/13055

See application file for complete search history.

(56) References Cited

U.S. PATENT DOCUMENTS

| | | |
|---|---|---|
| 5,329,142 A | 7/1994 | Kitagawa et al. |
| 6,380,586 B1 | 4/2002 | Yoshikawa |

(Continued)

FOREIGN PATENT DOCUMENTS

| | | |
|---|---|---|
| CN | 102891172 A | 1/2013 |
| JP | H05-243561 A | 9/1993 |

(Continued)

*Primary Examiner* — Matthew Reames
*Assistant Examiner* — John Bodnar
(74) *Attorney, Agent, or Firm* — Rabin & Berdo, P.C.

(57) ABSTRACT

A trench gate type MOS gate structure is provided in an active region on a substrate front surface side, and a floating p-type region is provided in a mesa region between trenches. A groove is provided distanced from the trench in a surface layer on the substrate front surface side of the floating p-type region. A second gate electrode is provided across an insulation layer in the interior portion of the groove. The second gate electrode covers the surface on the substrate front surface side of the floating p-type region. Thus, the second gate electrode is embedded in a surface layer on the substrate front surface side of the floating p-type region between the floating p-type region and an interlayer dielectric, whereby the substrate front surface is flattened. Controllability of turn-on di/dt is high, mirror capacitance is low, and an element structure having an intricate pattern can be formed.

12 Claims, 30 Drawing Sheets

(51) Int. Cl.
*H01L 29/06* (2006.01)
*H01L 29/40* (2006.01)
*H01L 29/41* (2006.01)
*H01L 29/417* (2006.01)
*H01L 29/78* (2006.01)
*H01L 29/66* (2006.01)

(52) U.S. Cl.
CPC ...... *H01L 29/0865* (2013.01); *H01L 29/0882* (2013.01); *H01L 29/1095* (2013.01); *H01L 29/402* (2013.01); *H01L 29/407* (2013.01); *H01L 29/41* (2013.01); *H01L 29/417* (2013.01); *H01L 29/4236* (2013.01); *H01L 29/4238* (2013.01); *H01L 29/42368* (2013.01); *H01L 29/42376* (2013.01); *H01L 29/66348* (2013.01); *H01L 29/78* (2013.01)

(56) References Cited

U.S. PATENT DOCUMENTS

| | | | |
|---|---|---|---|
| 7,696,045 | B2 | 4/2010 | Kawahara |
| 9,064,925 | B2 | 6/2015 | Rahimo et al. |
| 2003/0160270 | A1* | 8/2003 | Pfirsch ............ H01L 29/402 257/288 |
| 2005/0161768 | A1 | 7/2005 | Sugiyama et al. |
| 2007/0040215 | A1 | 2/2007 | Ma et al. |
| 2011/0233684 | A1 | 9/2011 | Matsushita |
| 2013/0020634 | A1* | 1/2013 | Watanabe ........ H01L 29/66348 257/330 |
| 2013/0328105 | A1 | 12/2013 | Matsuura |
| 2014/0231865 | A1 | 8/2014 | Onozawa |

FOREIGN PATENT DOCUMENTS

| | | | |
|---|---|---|---|
| JP | 2000-228519 | A | 8/2000 |
| JP | 2005-191221 | A | 7/2005 |
| JP | 2005-223228 | A | 8/2005 |
| JP | 2008-53276 | A | 3/2008 |
| JP | 2009-194044 | A | 8/2009 |
| JP | 2010-272741 | A | 12/2010 |
| JP | 2011-204803 | A | 10/2011 |
| JP | 2013-522924 | A | 6/2013 |
| JP | 2013-258190 | A | 12/2013 |
| WO | WO-2013/080806 | A1 | 6/2013 |

* cited by examiner

SEMICONDUCTOR DEVICE

CROSS-REFERENCE TO RELATED APPLICATION(S)

This non-provisional Application for a U.S. Patent is a Continuation of International Application PCT/JP2015/053492 filed Feb. 9, 2015, which claims priority from JP PA 2014-056610 filed Mar. 19, 2014, the entire contents of both of which are hereby incorporated by reference.

BACKGROUND OF THE INVENTION

1. Field of the Invention

The present invention relates to a semiconductor device.

2. Background of the Related Art

A trench gate type IGBT (insulated gate bipolar transistor) including a p-type base region that forms floating potential without being connected to an emitter electrode (hereafter referred to as a floating p-type region) in a mesa region between trenches is already in the public domain. A trench gate type IGBT including a floating p-type region is such that holes in the vicinity of the floating p-type region in the interior of an $n^-$-type drift layer are unlikely to be swept out to the emitter electrode when turning on, because of which holes accumulate in this portion. Therefore, there is a relative enhancement of an injection of electrons into the $n^-$-type drift layer, and the on-state voltage is lower than in a normal trench gate type IGBT.

However, a trench gate type IGBT including a floating p-type region is such that the floating p-type region and a gate electrode are opposed across a gate insulating film provided on a trench side wall, because of which a displacement current in accordance with the gate-collector capacitance flows into the floating p-type region via the gate electrode when turning on. The input capacitance is charged by the displacement current, whereby the gate voltage rises, because of which the rate of change of the collector current when turning on (di/dt, hereafter referred to as turn-on di/dt) increases (the switching speed when turning on increases). That is, there is a problem in that controllability of the turn-on di/dt is poor.

A trench gate type IGBT wherein the substrate front surface side surface, and a side surface along a trench, of a floating p-type region are enclosed across a gate insulating film by a gate electrode is known as a device that eliminates this problem. This trench gate type IGBT is such that the potential of the floating p-type region rises in accompaniment to a rise in the gate voltage before holes injected from a $p^-$-type collector layer into an $n^-$-type drift layer when turning on are injected into the floating p-type region. Therefore, an accumulation of holes in the floating p-type region when turning on is restricted, whereby controllability of the turn-on di/dt improves.

A device wherein a gate electrode provided in the interior of the trench is drawn out onto the substrate front surface side surface of the floating p-type region has been proposed as a device wherein the substrate front surface side surface, and a side surface along a trench, of a floating p-type region are enclosed across a gate insulating film by a gate electrode, for example, refer to paragraph 39 and FIG. 9 of JP-A-2005-191221 (Patent Literature 1) and paragraph 0039 and FIG. 31 of JP-A-2010-272741 (Patent Literature 3). Also, a device wherein a gate electrode is continuously formed along a multiple of grooves, and an embedded insulated gate structure is also formed in a region in which no electron injection channel is formed, has been proposed as another device, for example, refer to paragraph 0099 and FIGS. 85, 87, 91, and 93 of JP-A-05-243561 (Patent Literature 2).

However, there is a problem with the existing technology in that, due to a gate electrode also being provided across a gate insulating film on the substrate front surface side surface of the floating p-type region, the mirror capacitance (gate-collector capacitance whose gain is doubled by the mirror effect, functioning as input capacitance) increases remarkably compared with a trench gate type IGBT including a normal floating p-type region. This problem is eliminated by, for example, the gate electrode being disposed across a thick oxide film such as LOCOS (local oxidation of silicon) on the substrate front surface side surface of the floating p-type region. However, there is a problem in that a large difference in level of the element front surface in an active region is caused by the LOCOS, because of which formation of an element structure with an intricate pattern is difficult.

The embodiment, in order to eliminate the problems of the existing technology, has an object of providing a semiconductor device such that controllability of turn-on di/dt is high, mirror capacitance is small, and an element structure with an intricate pattern can be formed.

SUMMARY OF THE INVENTION

In order to resolve the heretofore described problems, thereby achieving the object of the embodiment, a semiconductor device according to the embodiment has the following characteristics. A second conductivity type second semiconductor layer is selectively provided in one surface layer of a first conductivity type first semiconductor layer. A first conductivity type third semiconductor layer is selectively provided in the interior of the second semiconductor layer. A trench penetrating the second semiconductor layer and the third semiconductor layer to reach the first semiconductor layer is provided. A second conductivity type fourth semiconductor layer is selectively provided in one surface layer of the first semiconductor layer. The fourth semiconductor layer is isolated from the second semiconductor layer by the trench. An interlayer dielectric that covers the fourth semiconductor layer is provided. A second conductivity type fifth semiconductor layer is provided in another surface layer of the first semiconductor layer. A first electrode is provided conductively connected to the second semiconductor layer and the third semiconductor layer and electrically isolated from the fourth semiconductor layer by the interlayer dielectric. A second electrode conductively connected to the fifth semiconductor layer is provided. A gate insulating film is provided along an inner wall of the trench in the interior of the trench. A first gate electrode is provided on the inner side of the gate insulating film in the interior of the trench. A groove is provided distanced from the trench on the interlayer dielectric side of the fourth semiconductor layer to a depth less than that of the fourth semiconductor layer. An insulation layer is provided along an inner wall of the groove in the interior of the groove and covering the fourth semiconductor layer. A second gate electrode is provided on the inner side of the insulation layer in the interior of the groove and covering the insulation layer.

Also, the heretofore described semiconductor device according to the embodiment is characterized in that an interface of the second gate electrode and the interlayer dielectric is of a height practically equivalent to that of an interface of the second semiconductor layer and first electrode.

Also, the heretofore described semiconductor device according to the embodiment is characterized in that the first gate electrode and the second gate electrode are isolated from each other in the direction in which the trench and the groove are aligned.

Also, the heretofore described semiconductor device according to the embodiment is characterized in that the insulation layer is a locally oxidized film.

Also, in order to resolve the heretofore described problems, thereby achieving the object of the embodiment, a semiconductor device according to the embodiment has the following characteristics. A second conductivity type second semiconductor layer is selectively provided in one surface layer of a first conductivity type first semiconductor layer. A first conductivity type third semiconductor layer is selectively provided in the interior of the second semiconductor layer. A trench penetrating the second semiconductor layer and the third semiconductor layer to reach the first semiconductor layer is provided. A second conductivity type fourth semiconductor layer is selectively provided in one surface layer of the first semiconductor layer. The fourth semiconductor layer is isolated from the second semiconductor layer by the trench. An interlayer dielectric that covers the fourth semiconductor layer is provided. A second conductivity type fifth semiconductor layer is provided in another surface layer of the first semiconductor layer. A first electrode is provided conductively connected to the second semiconductor layer and the third semiconductor layer and electrically isolated from the fourth semiconductor layer by the interlayer dielectric. A second electrode conductively connected to the fifth semiconductor layer is provided. A gate insulating film is provided along an inner wall of the trench in the interior of the trench. A first gate electrode is provided on the inner side of the gate insulating film in the interior of the trench. An insulation layer is provided distanced from the trench on the fourth semiconductor layer and covering the fourth semiconductor layer. A second gate electrode is provided distanced farther than the insulation layer from the trench on the insulation layer and covering the insulation layer.

Also, the heretofore described semiconductor device according to the embodiment is characterized in that the interval between the insulation layer and the trench is equal to or greater than the thickness of the insulation layer.

Also, the heretofore described semiconductor device according to the embodiment is characterized in that an end portion of the insulation layer has an inclination whose thickness decreases nearing the trench side, and the second gate electrode covers the whole of a thick portion of the insulation layer other than the end portion.

Also, the heretofore described semiconductor device according to the embodiment is characterized in that an end portion of the second gate electrode is of a tapered form that inclines in the same direction as the inclination of the end portion of the insulation layer, and gently joins the inclination of the end portion of the insulation layer.

Advantageous Effects of Embodiment of Invention

According to the semiconductor device according to the embodiment, advantages are achieved in that controllability of turn-on di/dt can be improved, mirror capacitance can be reduced, and difference in level of an element surface can be reduced, because of which an element structure of an intricate pattern can be formed.

DETAILED DESCRIPTION OF THE INVENTION

Hereafter, referring to the attached drawings, a detailed description will be given of preferred embodiments of a semiconductor device according to the embodiment. A layer or region being prefixed with n or p in the specification and attached drawings means that electrons or holes respectively are majority carriers. Also, + or − being added to n or p means that a layer or region is of a higher impurity concentration or lower impurity concentration respectively than a layer or region to which neither is added. The same reference signs are given to the same configurations in the following description of the embodiments and in the attached drawings, and redundant descriptions are omitted.

First Embodiment

Figure 1:
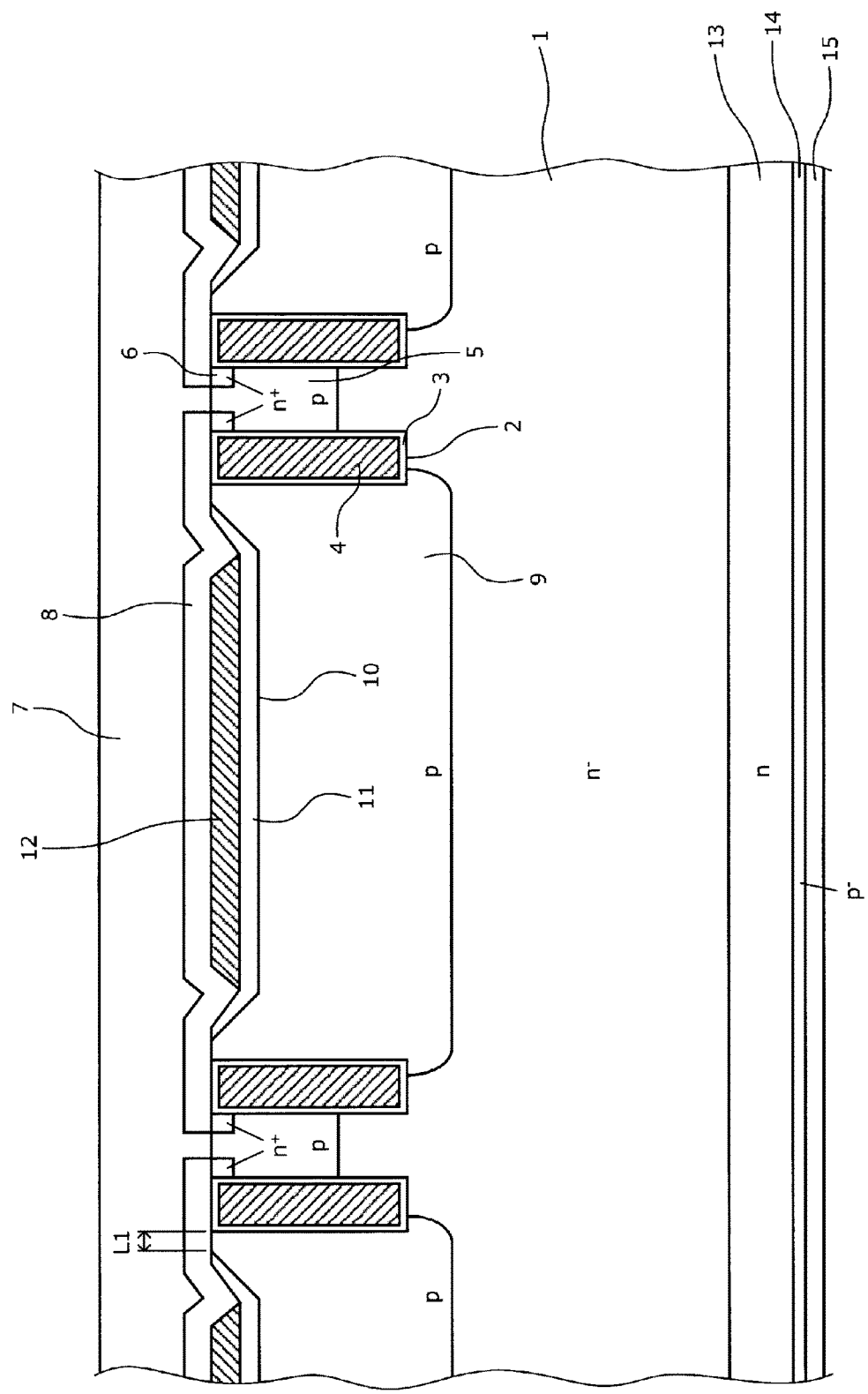
FIG. 1 is a sectional view showing the structure of an active region of a semiconductor device according to a first embodiment.
Figure 2:
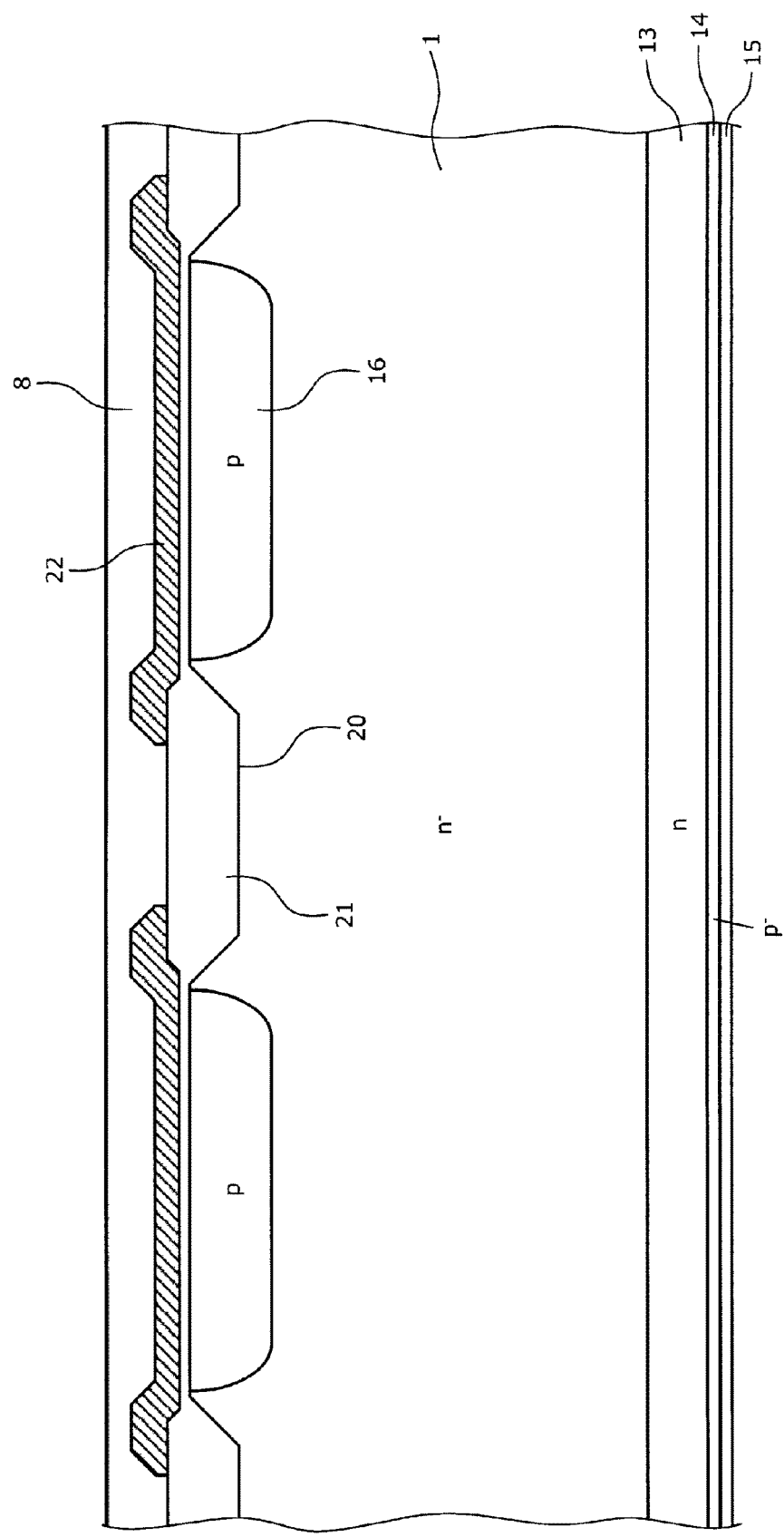
FIG. 2 is a sectional view showing the structure of an edge termination structure portion of the semiconductor device according to the first embodiment.

A description will be given of the structure of a semiconductor device according to a first embodiment. FIG. 1 is a sectional view showing the structure of an active region of the semiconductor device according to the first embodiment. FIG. 2 is a sectional view showing the structure of an edge termination structure portion of the semiconductor device according to the first embodiment. As shown in FIG. 1, the semiconductor device according to the first embodiment includes a trench gate type MOS gate (an insulated gate formed of metal-oxide-semiconductor) structure, and a floating potential p-type base region (floating p-type region (fourth semiconductor layer)) 9 provided in a mesa region between trenches 2, in the active region. The active region is a region through which current flows (a region that bears current drive) in the ON time.

Specifically, the trench 2 is provided in the active region to a predetermined depth from the front surface in an $n^-$-type semiconductor substrate (semiconductor chip) that forms an $n^-$-type drift layer (first semiconductor layer) 1. The trench 2 may be such that, for example, a multiple of the trench 2 are disposed in stripe form, or may be disposed in a ring form enclosing the periphery of a p-type base region (second semiconductor layer) 5, to be described hereafter, by end portions of a neighboring pair of trenches 2 disposed in stripe form being coupled. A gate insulating film 3 is provided along the inner wall of the trench 2 in the interior portion of the trench 2, and a first gate electrode 4 is provided on the inner side of the gate insulating film 3. Also, the p-type base region 5 is provided so as to be in contact with the gate insulating film 3 on the side wall of the trench 2 in a surface layer on the substrate front surface side of the $n^-$-type drift layer 1. The depth of the p-type base region 5 is less than the depth of the trench 2. An $n^+$-type emitter region (third semiconductor layer) 6 is selectively provided in a surface layer on the substrate front surface side in the interior of the p-type base region 5.

The $n^+$-type emitter region 6 opposes the first gate electrode 4 across the gate insulating film 3 on the side wall of the trench 2. A trench gate type MOS gate structure is configured of the trench 2, the gate insulating film 3, the first gate electrode 4, the p-type base region 5, and the $n^+$-type emitter region 6. An emitter electrode 7 is in contact with the $n^+$-type emitter region 6 and the p-type base region 5 via a contact hole penetrating an interlayer dielectric 8 in the depth direction, and is electrically isolated from the first gate electrode 4 by the interlayer dielectric 8. Also, the p-type region (floating p-type region) 9, electrically isolated from the emitter electrode (first electrode) 7 by the interlayer dielectric 8, is provided in a surface layer on the substrate front surface side of the $n^-$-type drift layer 1.

The floating p-type region 9 is provided in a mesa region between adjacent trenches 2 so as to be in contact with the gate insulating film 3 on the side wall of the trench 2. Also, the floating p-type region 9 is separated from the p-type base region 5 by the trench 2 and the p-n junction between the floating p-type region 9 and $n^-$-type drift layer 1. The depth of the floating p-type region 9 is, for example, greater than the depth of the trench 2, and a corner portion on the lower side (substrate back surface side) of the floating p-type region 9 extends to, for example, a position covering one portion of the bottom surface of the trench 2. The floating p-type region 9 has a function of accumulating holes injected from the collector side when turning on, thereby maintaining breakdown voltage.

A groove 10 is provided in a surface layer on the substrate front surface side of the floating p-type region 9, distanced from the trench 2 and to a depth less than that of the floating p-type region 9. The groove 10, for example, has a linear planar form extending in a direction (the depth direction of the drawing in FIG. 1, hereafter referred to as the trench longitudinal direction) perpendicular to the alignment direction of the trench 2 (hereafter referred to as the trench lateral direction). It is preferable for manufacturing process purposes that an interval (an interval in the trench lateral direction) L1 between the groove 10 and the trench 2 is as small as possible. The reason for this is that the wider the range over which the floating p-type region 9 is covered by a second gate electrode 12, to be described hereafter, the easier it is to obtain an advantage of preventing a rise in the potential of the floating p-type region 9 when turning on.

Specifically, the interval L1 between the groove 10 and trench 2 may be, for example, 0.5 μm or more, 3.0 μm or less. The lower limit of the interval L1 between the groove 10 and trench 2 is determined considering, for example, alignment accuracy and variation in the fabrication processes for forming a structure in the vicinity of the groove 10 and the trench 2. The upper limit of the interval L1 between the groove 10 and the trench 2 is the upper limit of an optimum value for obtaining the advantages of the embodiment. Also, it is preferable that the depth of the groove 10 is a depth such that the upper surface (that is, the surface on the interlayer dielectric 8 side) of the second gate electrode 12, which forms an upper layer portion in the interior of the groove 10, is in practically the same position as the substrate front surface. The reason for this is that greater element surface smoothness can be achieved.

An insulation layer 11 formed of an oxide film ($SiO_2$) such as LOCOS is provided along the inner wall of the groove 10 in the interior portion of the groove 10. The insulation layer 11 covers the substrate front surface side of the floating p-type region 9. Also, the second gate electrode 12 is provided on the inner side of the insulation layer 11 in the interior portion of the groove 10. The second gate electrode 12 covers the substrate front surface side of the floating p-type region 9 across the insulation layer 11. That is, the interior of the groove 10 is of a two-layer structure, a lower layer portion formed of the insulation layer 11 and an upper layer portion formed of the second gate electrode 12. The thickness of the insulation layer 11 can be variously changed in accordance with design conditions, but is preferably a thickness of such an extent that the mirror capacitance (gate-collector capacitance whose gain is doubled by the mirror effect, functioning as input capacitance) can be reduced to a predetermined amount. Specifically, the thickness of the insulation layer 11 may be in the region of, for example, 0.5 μm. Furthermore, the mirror capacitance can be reduced by the thickness of the gate insulating film 3 provided on the side wall on the floating p-type region 9 side of the trench 2 being increased, which is preferable.

The second gate electrode 12 is disposed so as to be embedded in a surface layer on the substrate front surface side of the floating p-type region 9 between the floating p-type region 9 and the interlayer dielectric 8, whereby the substrate front surface is flattened. The second gate electrode 12 is preferably provided so as to cover practically the whole of the substrate front surface side surface of the floating p-type region 9 across the insulation layer 11. The reason for this is as follows. The potential of the floating p-type region 9 rises in accompaniment to a rise in the gate voltage before holes injected from a $p^+$-type collector layer 14 into the $n^-$-type drift layer 1 when turning on are injected into the floating p-type region 9. Therefore, an accumulation of holes in the floating p-type region 9 is restricted, whereby controllability of the turn-on di/dt can be improved. The thickness of the second gate electrode 12 can be variously changed in accordance with design conditions, and may be in the region of, for example, 0.8 μm.

Also, the second gate electrode 12 is electrically isolated from the emitter electrode 7 by the interlayer dielectric 8. Also, the second gate electrode 12 is electrically connected to the first gate electrode 4 in, for example, an edge termination structure portion omitted from the drawing. The edge termination structure portion is a region that encloses the periphery of the active region through which current flows in the ON time, relaxing an electrical field on the substrate front surface side and maintaining breakdown voltage. Specifically, an end portion in the trench longitudinal direction of the second gate electrode 12 may be electrically connected to an end portion in the trench longitudinal direction of the first gate electrode 4 in the vicinity of the boundary between the active region and the edge termination structure portion, or may be electrically connected to a ring-form gate wire (not shown) disposed so as to enclose the periphery of the active region.

Also, the second gate electrode 12 is electrically isolated from the first gate electrode 4 by the interlayer dielectric 8 in the trench lateral direction. That is, the second gate electrode 12 and the insulation layer 11 are not provided on the surface of the $n^-$-type drift layer 1 in a portion sandwiched between the trench 2 and the groove 10. When the gate electrode in the interior of the trench extends as far as the substrate front surface, as in, for example, PTLs 1 to 3, the manufacturing process becomes complicated when etching the gate electrode. As opposed to this, in the embodiment, the second gate electrode 12 and the first gate electrode 4 (or gate wire) can be electrically connected in the trench longitudinal direction, as heretofore described, because of which there is no need for the second gate electrode 12 and the first gate electrode 4 to be connected in the trench lateral direction, meaning that the manufacturing process can be simplified.

Also, as shown in FIG. 2, the heretofore described active region structure may be applied to an edge termination structure portion configured of a multiple of floating p-type guard ring regions 16. Specifically, the edge termination structure portion is disposed so as to enclose the periphery of the active region. The edge termination structure portion has a function of relaxing an electrical field on the substrate front surface side of the $n^-$-type drift layer 1, thereby maintaining breakdown voltage. The multiple of p-type guard ring regions 16 are provided in ring form enclosing the periphery of the active region in a surface layer on the substrate front surface side of the $n^-$-type drift layer 1 in the edge termination structure portion. A groove 20 is provided in a portion of the $n^-$-type drift layer 1 sandwiched between neighboring p-type guard ring regions 16. The groove 20 is disposed in a ring form along the p-type guard ring region 16 at a depth less than that of, for example, the p-type guard ring region 16.

An insulation layer 21 formed of an oxide film ($SiO_2$) such as LOCOS, or the like, is provided in the interior of the groove 20. The upper surface (the surface on the interlayer dielectric 8 side) of the insulating layer 21 is preferably of a height practically the same as that of, for example, the substrate front surface. The reason for this is that a large difference in level of the element surface in the active region caused by the insulation layer 21 and a field plate 22, to be described hereafter, can be prevented from occurring. The field plate 22, formed of polysilicon (poly-Si), is provided over the p-type guard ring region 16 so as to extend over the insulation layer 21 neighboring the p-type guard ring region 16. The surface of the field plate 22, and the surface of the insulation layer 21 in a portion not covered by the field plate 22, are covered by the interlayer dielectric 8 extending from the active region.

An n-type field stop layer 13 is provided from the active region to the edge termination structure portion in a surface layer of the back surface of the $n^-$-type semiconductor substrate. Also, the $p^+$-type collector layer (fifth semiconductor layer) 14 is provided to a depth less than that of the n-type field stop layer 13 from the substrate back surface, from the active region to the edge termination structure portion, in a surface layer of the back surface of the $n^-$-type semiconductor substrate. A collector electrode (second electrode) 15 is provided over the whole of the back surface of the $n^-$-type semiconductor substrate, that is, the whole of the surface of the $p^+$-type collector layer 14.

According to the first embodiment, as heretofore described, turn-on di/dt controllability can be improved by the surface of a floating p$^+$-type region being covered by a second gate electrode across an insulation layer. Also, according to the first embodiment, mirror capacitance can be reduced by the insulation layer between the floating p$^+$-type region and the second gate electrode being a thick insulation layer such as LOCOS. Also, according to the first embodiment, a difference in level of an element surface can be alleviated by a groove being formed in the substrate front surface of the floating p$^+$-type region, and the insulation layer and the second gate electrode being stacked sequentially in the interior of the groove. Therefore, an element structure with an intricate pattern can be formed on the substrate front surface side. Also, according to the first embodiment, the flatness of the element surface increases, because of which partial concentration of stress on the element surface can be restricted. Therefore, failures when carrying out wire bonding can be reduced, and power cycle resistance can be increased.

Also, the previously existing technology is such that a polysilicon layer configuring a second gate electrode protrudes upward (to the emitter electrode side) from the substrate front surface, because of which there is concern that cracking will occur due to stress being exerted on a corner portion of the polysilicon layer, and the second gate electrode and the emitter electrode will be short circuited. The embodiment, however, is such that the second gate electrode is embedded in the interior portion of the groove provided in the active region, because of which the upper surface of the second gate electrode barely protrudes upward (to the emitter electrode side) at all from the substrate front surface. Therefore, the element front surface can be practically flattened, whereby the problem occurring with the existing technology can be avoided.

Also, according to the first embodiment, a difference in level of the element front surface in an edge termination structure portion can be reduced by a groove being provided in a portion of an n$^-$-type drift layer sandwiched between adjacent p-type guard ring regions, and an insulation layer being embedded in the interior portion of the groove. By flattening of the element front surface advancing, the range over which an intricate pattern of the front surface element structure can be formed can be widened, because of which the ratio of the chip area occupied by the active region can be increased.

Second Embodiment

Figure 3:
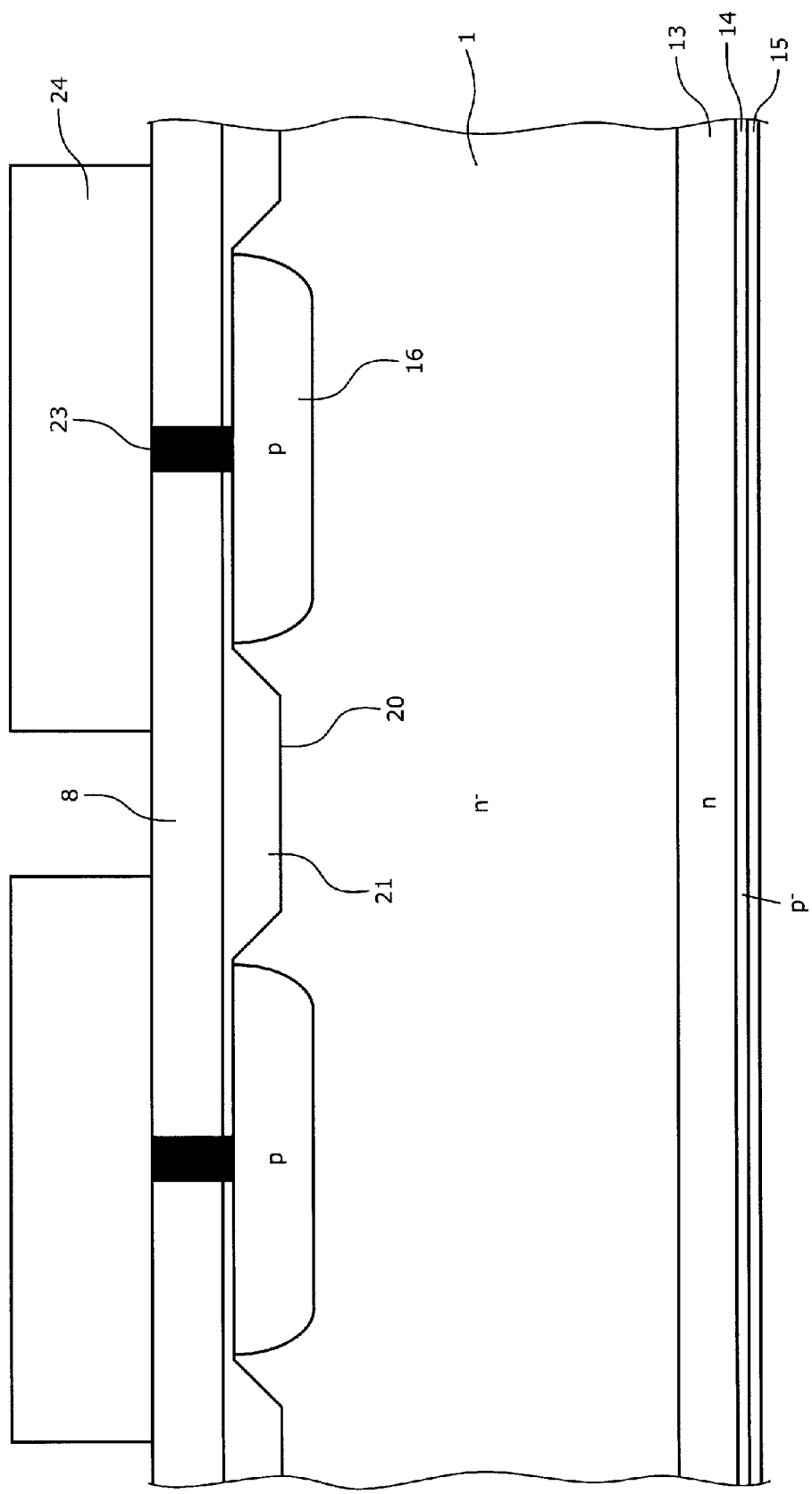
FIG. 3 is a sectional view showing the structure of an edge termination structure portion of a semiconductor device according to a second embodiment.

Next, a description will be given of the structure of a semiconductor device according to a second embodiment. FIG. 3 is a sectional view showing the structure of an edge termination structure portion of the semiconductor device according to the second embodiment. The semiconductor device according to the second embodiment differs from the semiconductor device according to the first embodiment in that a field plate 24 formed of metal is provided on the interlayer dielectric 8. That is, the semiconductor device according to the second embodiment is such that the structure of the edge termination structure portion differs from that in the semiconductor device according to the first embodiment. The structure of the active region in the semiconductor device according to the second embodiment is the same as that in the semiconductor device according to the first embodiment.

Specifically, as shown in FIG. 3, the insulation layer 21 is embedded in the interior portion of the groove 20, and covers the p-type guard ring region 16, in the edge termination structure portion. The interlayer dielectric 8 extending from the active region is provided on the insulation layer 21. The field plate 24 formed of metal is provided across the insulation layer 21 and the interlayer dielectric 8 above each p-type guard ring region 16. The field plate 24 is electrically connected to the p-type guard ring region 16 via an electrode plug 23 embedded in a contact hole penetrating the interlayer dielectric 8 and the insulation layer 21 in the depth direction to reach the p-type guard ring region 16. The electrode plug 23 is formed of, for example, tungsten (W).

According to the second example, as heretofore described, the same advantages as in the first embodiment can be obtained.

Third Embodiment

Figure 4:
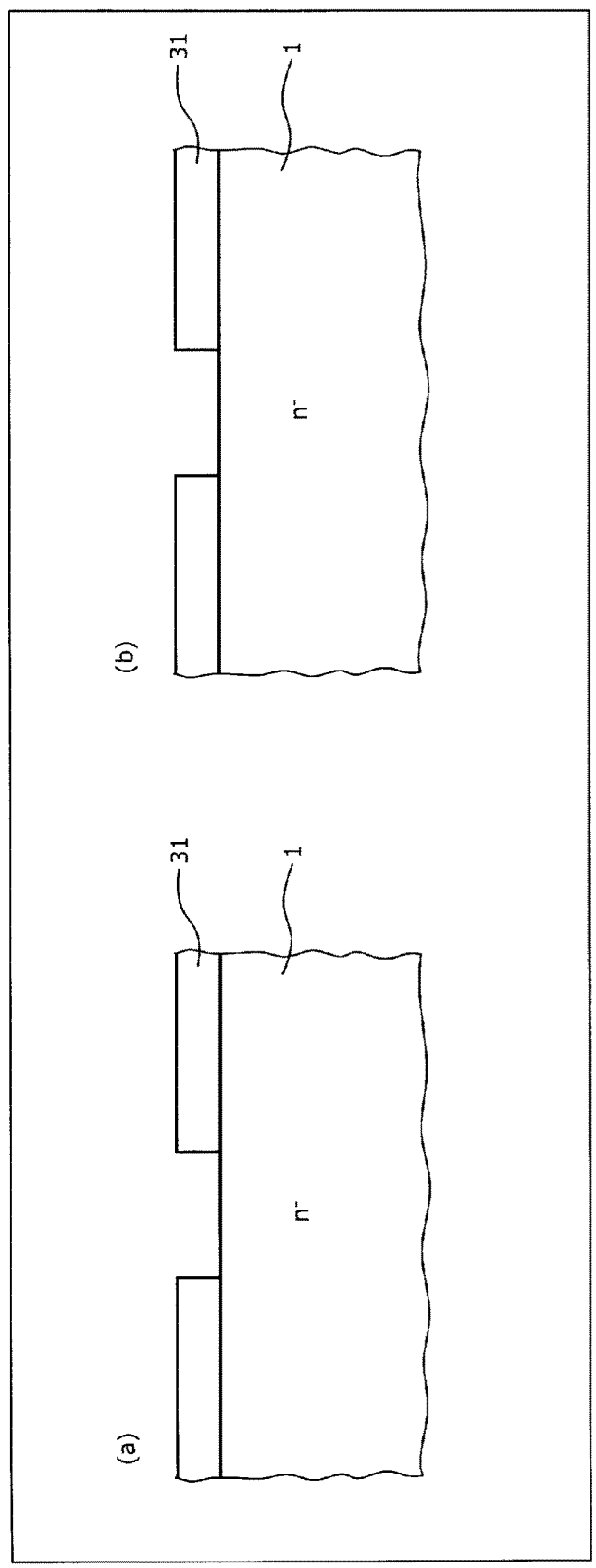
FIG. 4 is a sectional view showing a state partway through semiconductor device manufacture according to a third embodiment.

Next, a description will be given of a semiconductor device manufacturing method according to a third embodiment, with a case of fabricating (manufacturing) the semiconductor device according to the first embodiment as an example. FIGS. 4 to 17 are sectional views showing states partway through the semiconductor device manufacture according to the third embodiment. In FIGS. 4 to 17, (a) shows a state partway through the manufacturing of the active region, while (b) shows a state partway through the manufacturing of the edge termination structure portion. Firstly, as shown in FIG. 4, an n$^-$-type silicon (Si) wafer with a resistivity of 80 Ωcm fabricated using, for example, an FZ (floating zone) method is prepared as an n$^-$-type semiconductor wafer (hereafter referred to as the n$^-$-type semiconductor wafer 1) that forms the n$^-$-type drift layer 1. Next, a resist mask 31, in which a formation region of the groove 10 is opened in the active region and a formation region of the groove 20 is opened in the edge termination structure portion, is formed using photolithography on the front surface of the n$^-$-type semiconductor wafer 1.

Figure 5:
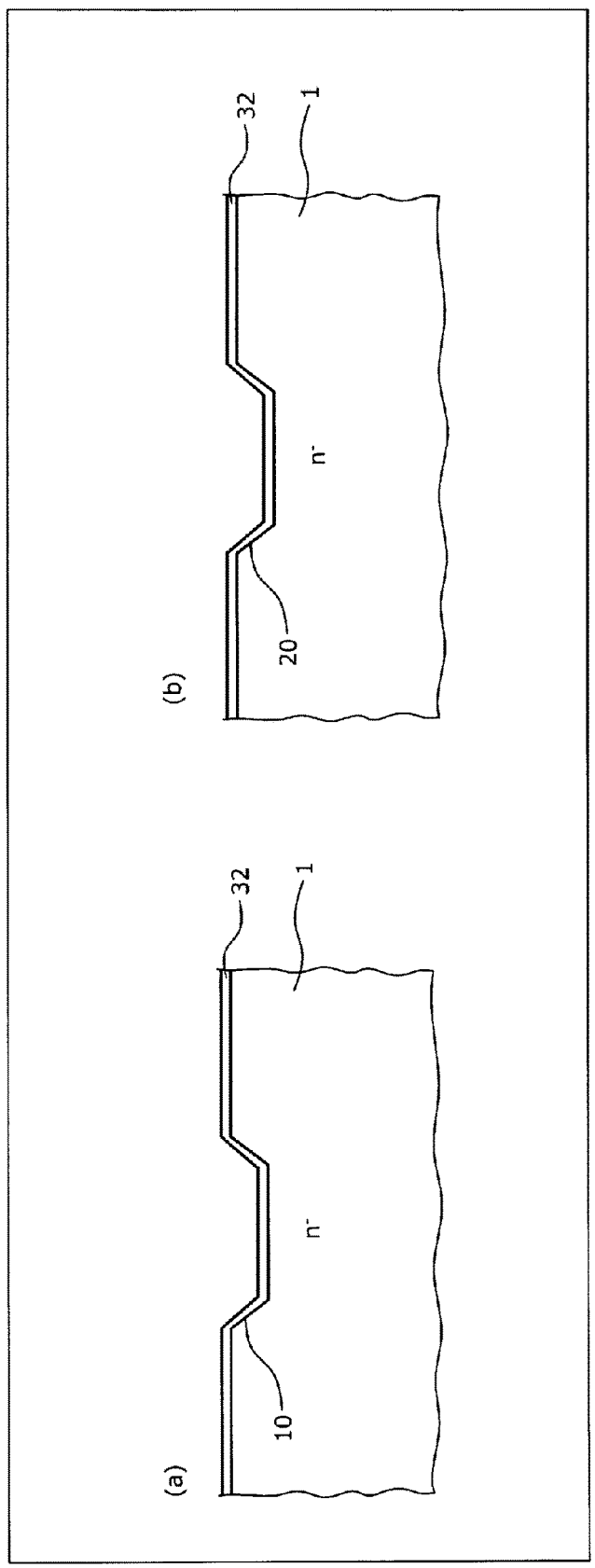
FIG. 5 is a sectional view showing a state partway through semiconductor device manufacture according to the third embodiment.
Figure 6:
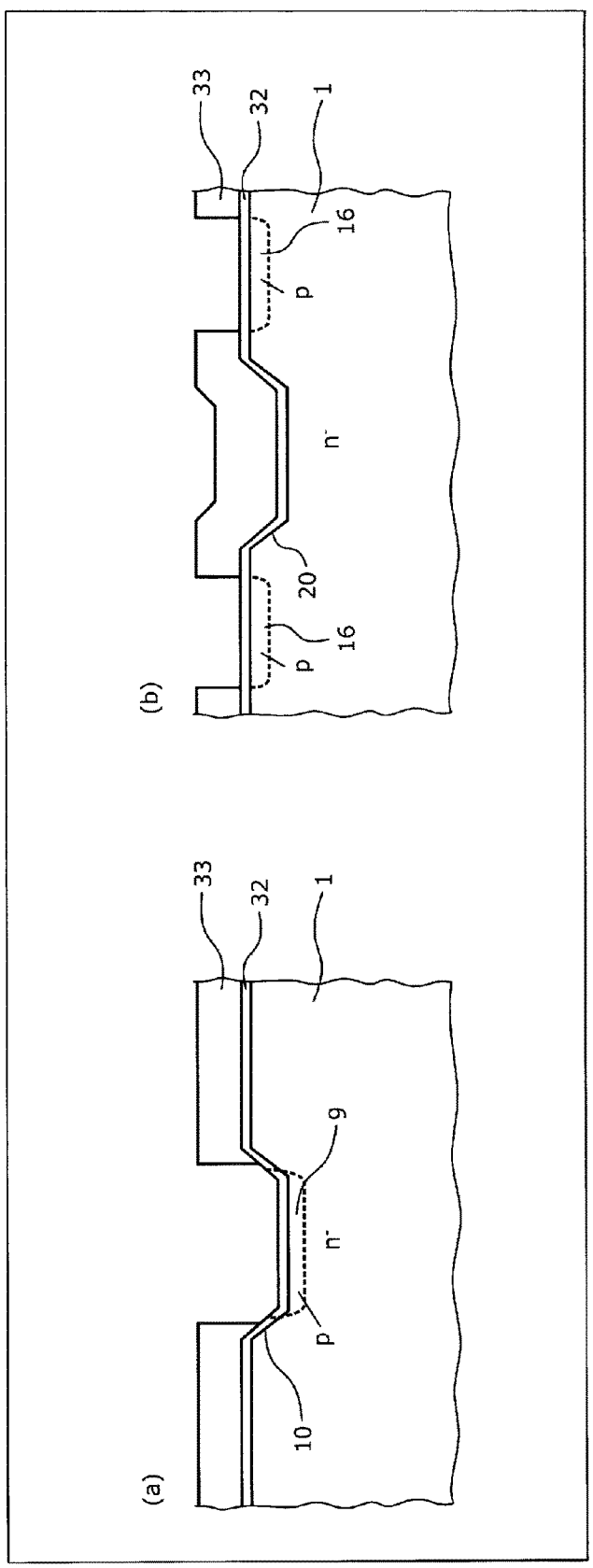
FIG. 6 is a sectional view showing a state partway through semiconductor device manufacture according to the third embodiment.

Next, plasma etching, for example, is carried out with the resist mask 31 as a mask. Owing to the plasma etching, the groove 10 is formed in, for example, a linear planar pattern in the active region, and the groove 20 is formed in a ring-form planar pattern enclosing the active region in the edge termination structure portion, on the front surface side of the n$^-$-type semiconductor wafer 1, as shown in FIG. 5. Next, after the resist mask 31 is removed, a screen oxide film 32 with a thickness of, for example, 350 Å is formed using a thermal oxidation process on the front surface of the n$^-$-type semiconductor wafer 1 and the inner walls of the grooves 10 and 20. Next, as shown in FIG. 6, a resist mask 33, in which a formation region of the floating p-type region 9 is opened in the active region and a formation region of the p-type guard ring region 16 is opened in the edge termination structure portion, is formed using photolithography on the screen oxide film 32.

Figure 7:
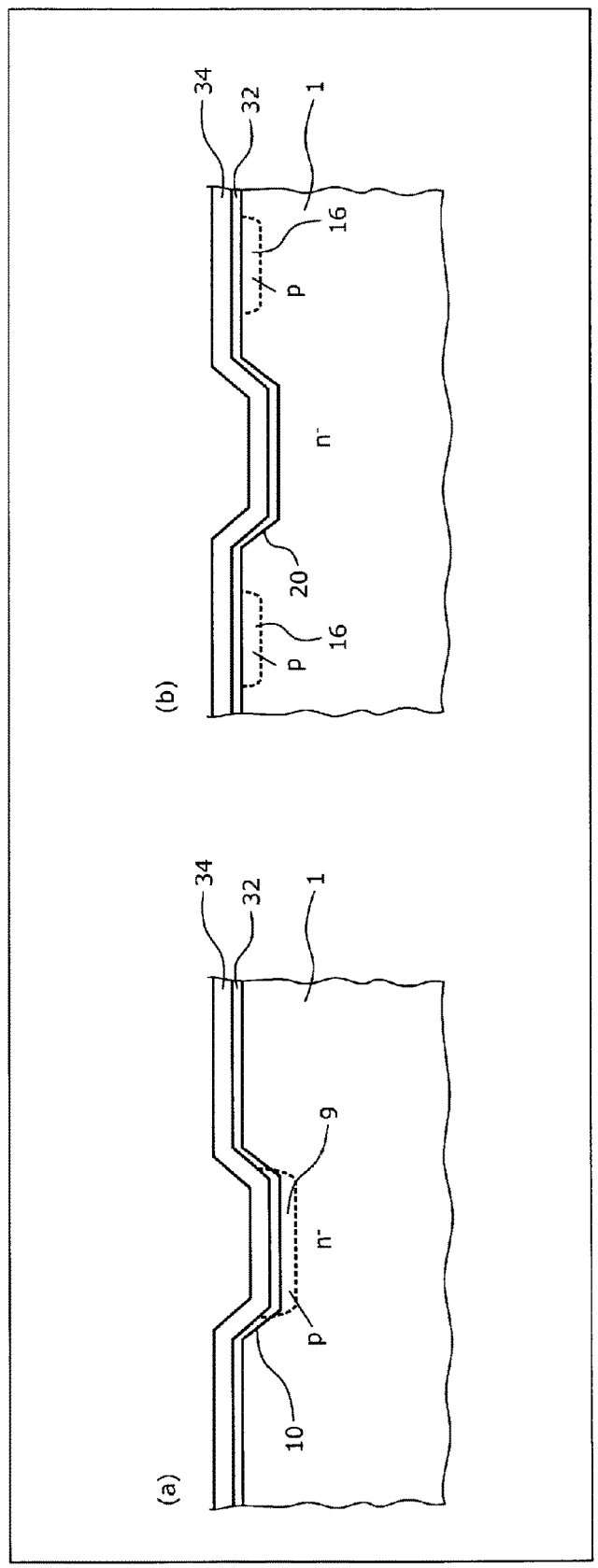
FIG. 7 is a sectional view showing a state partway through semiconductor device manufacture according to the third embodiment.

Next, with the resist mask 33 as a mask, a p-type impurity such as, for example, boron (B) is ion implanted through the screen oxide film 32. As shown in FIG. 6(a), the floating p-type region 9 is formed by the ion implantation in a surface layer of a silicon portion exposed in the bottom surface of the groove 10 in the active region. Also, as shown in FIG. 6(b), the p-type guard ring region 16 is formed simultaneously with the formation of the floating p-type region 9 in a surface layer of the front surface of the n$^-$-type semiconductor wafer 1 in the edge termination structure portion. Next, after the resist mask 33 is removed, a silicon nitride film ($Si_3N_4$ film) 34, for example, is deposited (formed) on the screen oxide film 32 using, for example, a physical vapor deposition (PVD) method or deposition method, as shown in FIG. 7.

Figure 8:
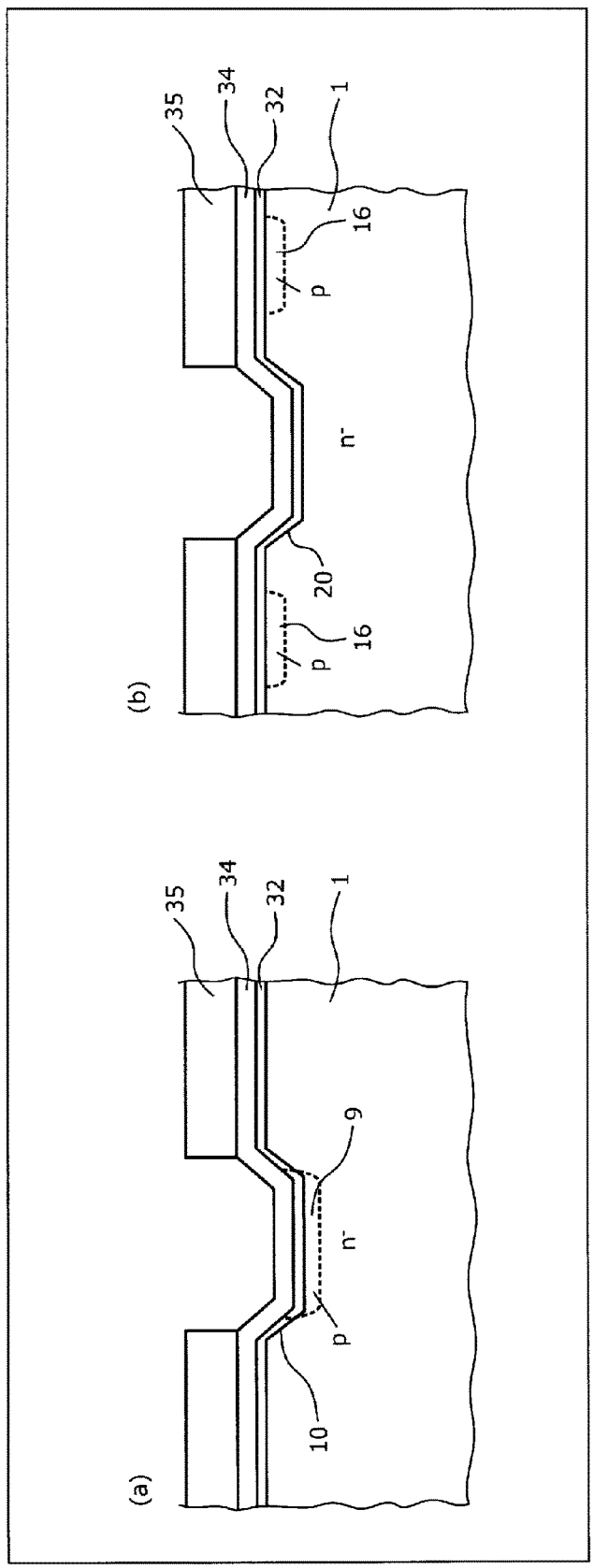
FIG. 8 is a sectional view showing a state partway through semiconductor device manufacture according to the third embodiment.
Figure 9:
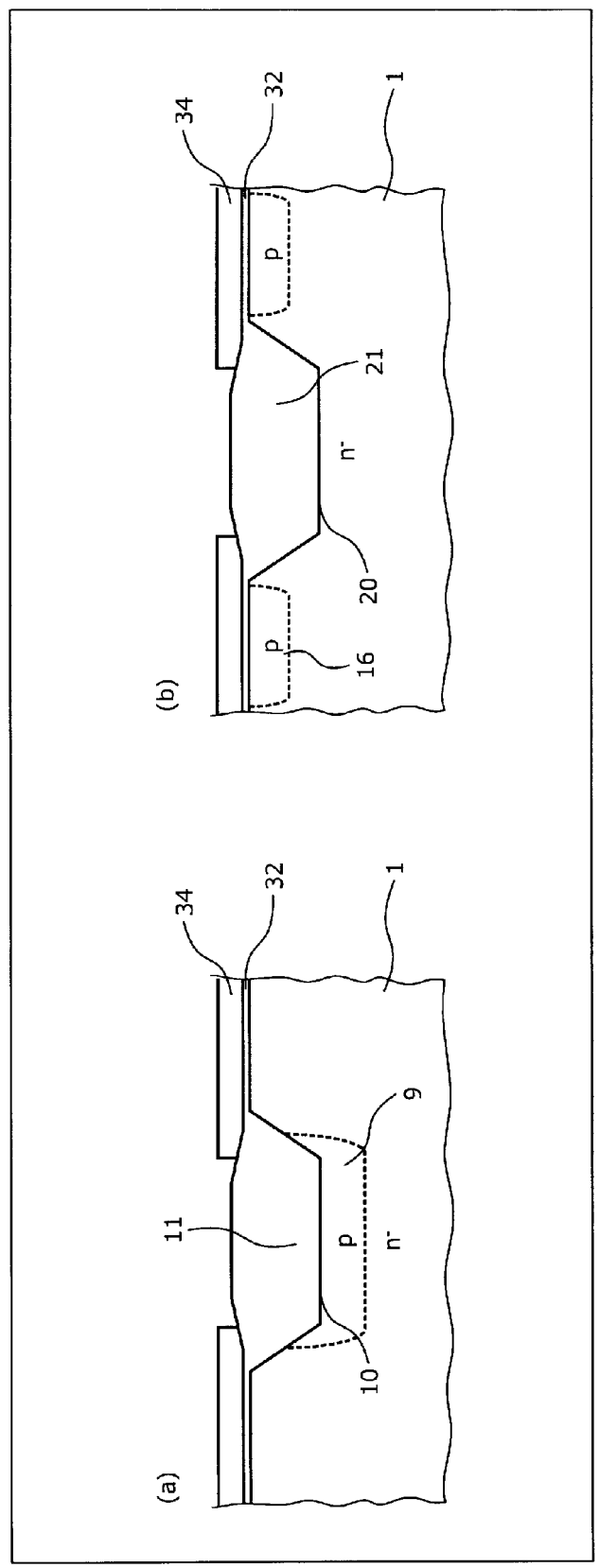
FIG. 9 is a sectional view showing a state partway through semiconductor device manufacture according to the third embodiment.

Next, as shown in FIG. 8, a resist mask 35 is formed using photolithography on the silicon nitride film 34 in such a way that the silicon nitride film 34 in the interiors of the grooves 10 and 20 is exposed. Next, plasma etching, for example, is carried out with the resist mask 35 as a mask, thereby removing the silicon nitride film 34 in the interiors of the grooves 10 and 20, as shown in FIG. 9. Next, after the resist mask 35 is removed, the silicon portion (the portion not covered by the remainder of the silicon nitride film 34) of the inner walls of the grooves 10 and 20 is locally oxidized (LOCOS) using a thermal process. The interiors of the grooves 10 and 20 are filled with the insulation layers 11 and 21 respectively by the local oxidation. Also, the floating p-type region 9 and p-type guard ring region 16 are thermally diffused by the thermal process for the local oxidation.

Figure 10:
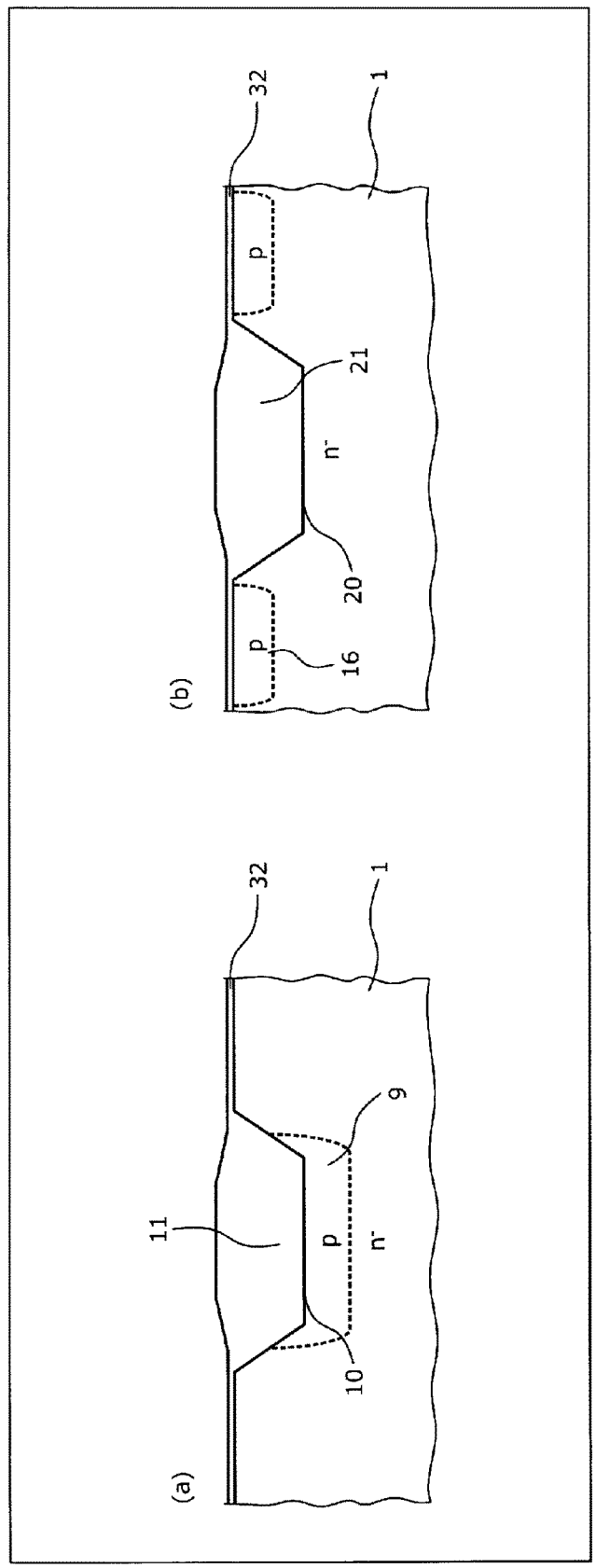
FIG. 10 is a sectional view showing a state partway through semiconductor device manufacture according to the third embodiment.
Figure 11:
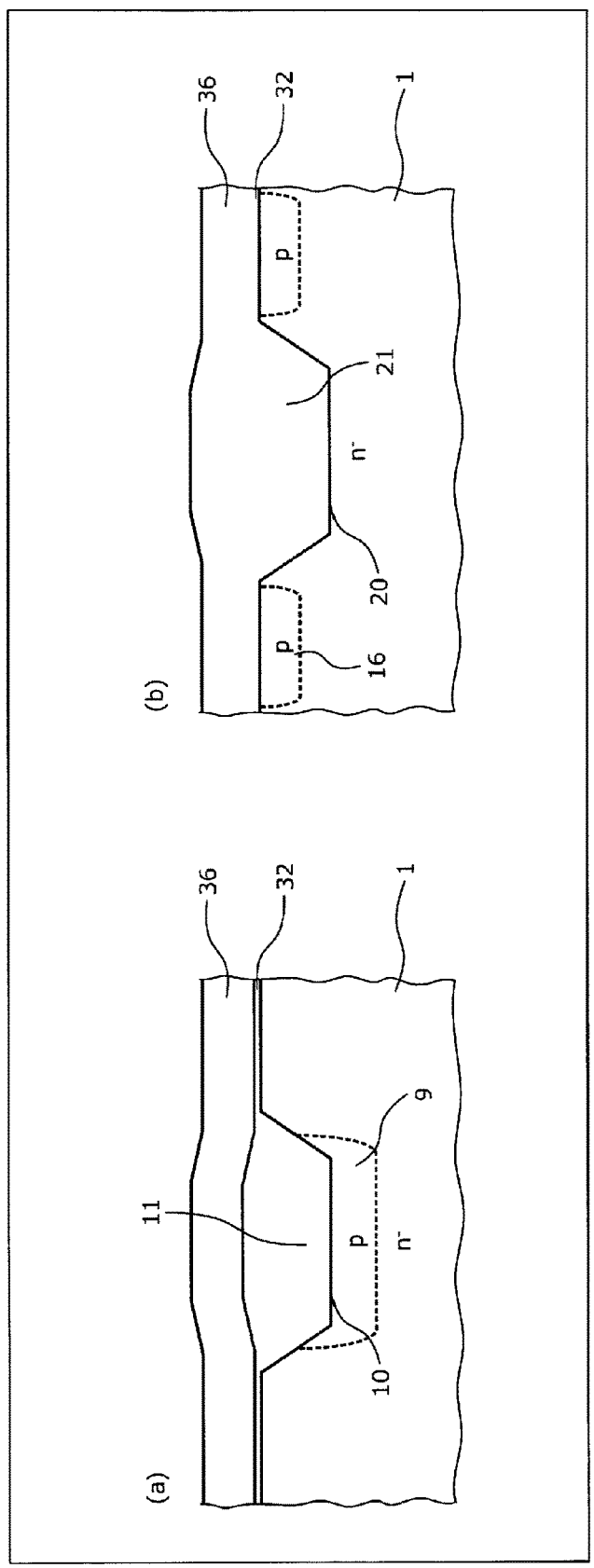
FIG. 11 is a sectional view showing a state partway through semiconductor device manufacture according to the third embodiment.
Figure 12:
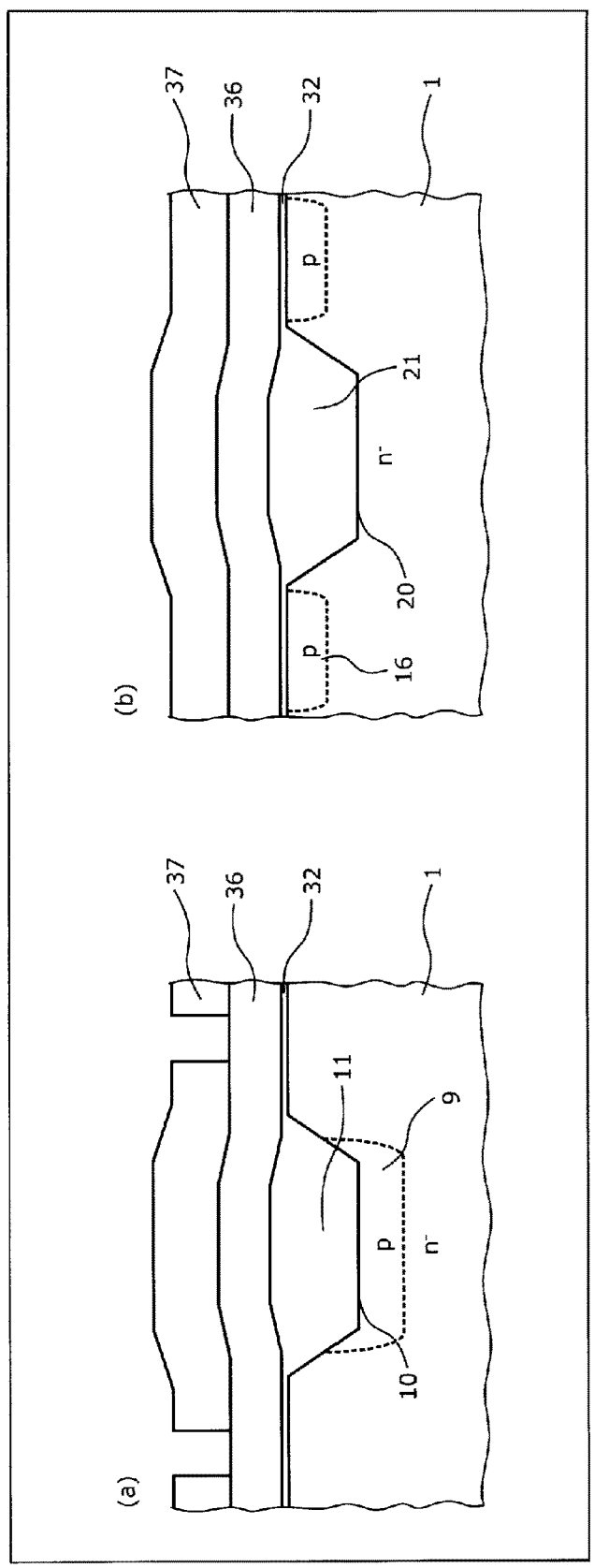
FIG. 12 is a sectional view showing a state partway through semiconductor device manufacture according to the third embodiment.
Figure 13:
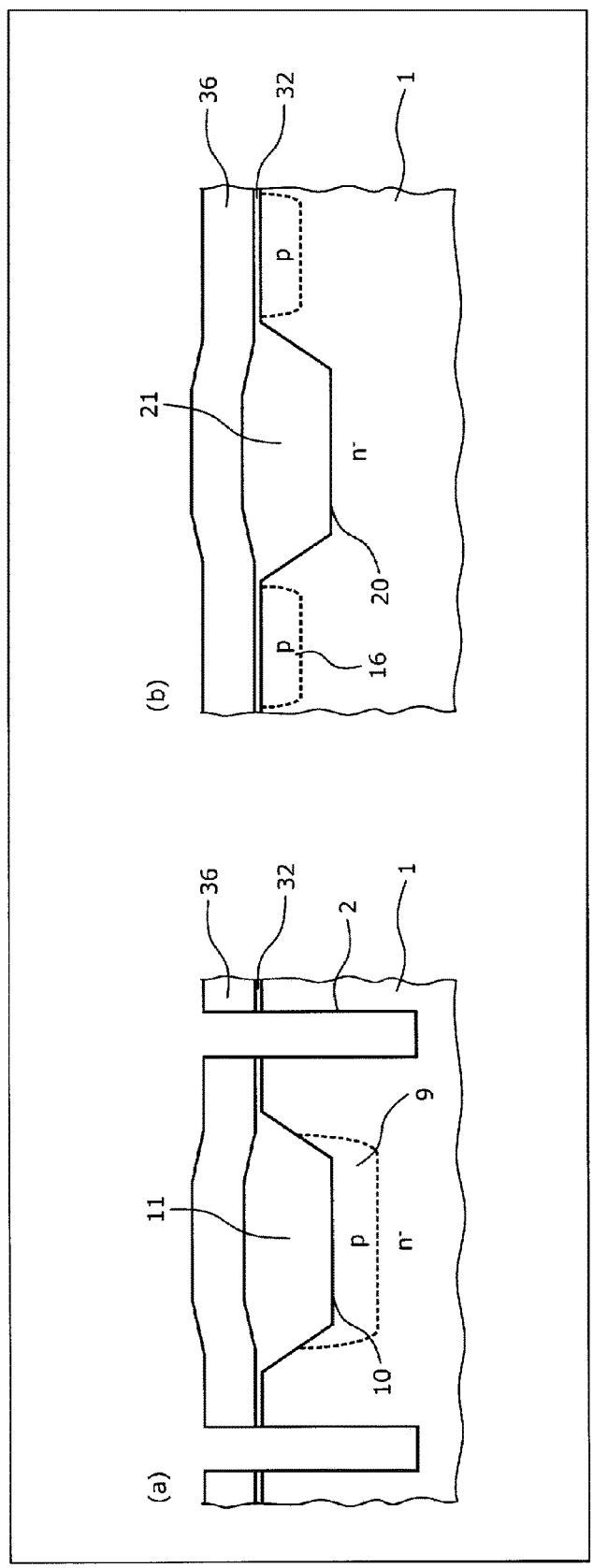
FIG. 13 is a sectional view showing a state partway through semiconductor device manufacture according to the third embodiment.

Next, as shown in FIG. 10, the whole of the silicon oxide film 34 is removed. Next, as shown in FIG. 11, a high temperature oxide (HTO) film 36 with a thickness of, for example, 4,000 Å is grown using a thermal process on the screen oxide film 32 and insulation layers 11 and 21. Next, as shown in FIG. 12, a resist mask 37 in which a formation region of the trench 2 is opened in the active region is formed using photolithography on the high temperature oxide film 36. Next, as shown in FIG. 13, an anisotropic dry etching, for example, is carried out with the resist mask 37 as a mask, thereby removing the portion of the high temperature oxide film 36 in the trench 2 formation region. Next, after the resist mask 37 is removed, an anisotropic etching, for example, is carried with the remainder of the high temperature oxide film 36 as a mask, thereby forming the trench 2 on the front surface side of the n$^-$-type semiconductor wafer 1.

Figure 14:
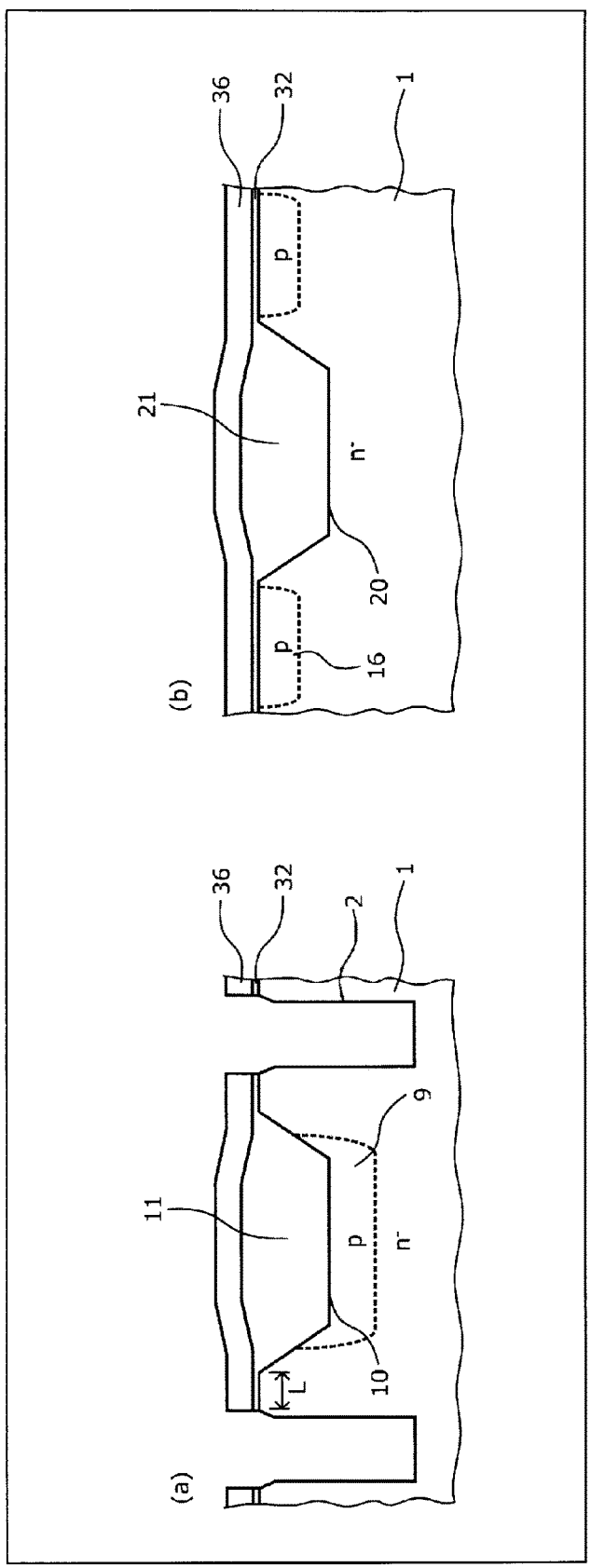
FIG. 14 is a sectional view showing a state partway through semiconductor device manufacture according to the third embodiment.
Figure 15:
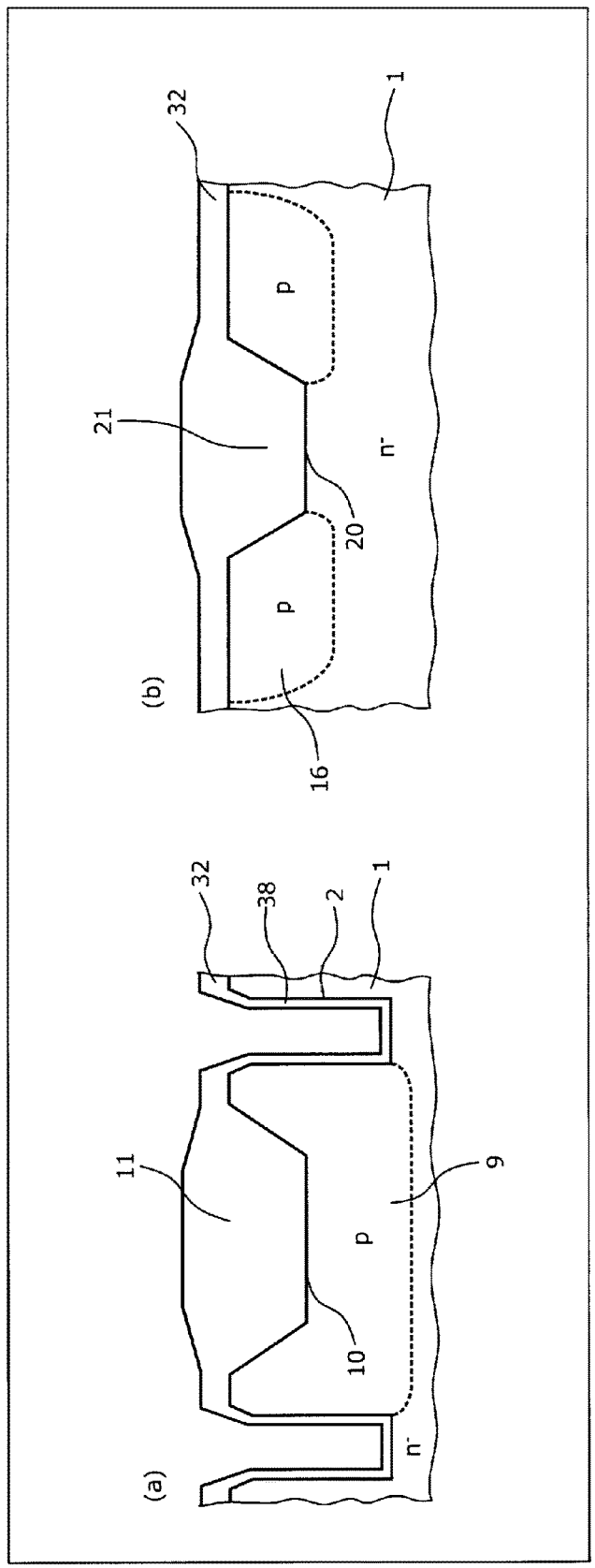
FIG. 15 is a sectional view showing a state partway through semiconductor device manufacture according to the third embodiment.

Next, the trench 2 may be further etched while causing the high temperature oxide film 36 to retreat (hereafter referred to as retreating etching), as shown in FIG. 14. Owing to the retreating etching, the thickness of the high temperature oxide film 36 decreases, the overall width of the trench 2 increases, and the width of an upper portion of the trench 2 becomes greater than the width of a lower portion. Next, after the whole of the remainder of the high temperature oxide film 36 is removed, a sacrificial oxide film 38 is formed using sacrificial oxidation on the inner wall of the trench 2, as shown in FIG. 15. At this time, the thicknesses of the insulation layers 11 and 21 and screen oxide film 32 increase by, for example, an amount equivalent to the thickness of the sacrificial oxide film 38. Next, the floating p-type region 9 and the p-type guard ring region 16 are caused to thermally diffuse to a predetermined diffusion depth using a drive-in thermal process.

Figure 16:
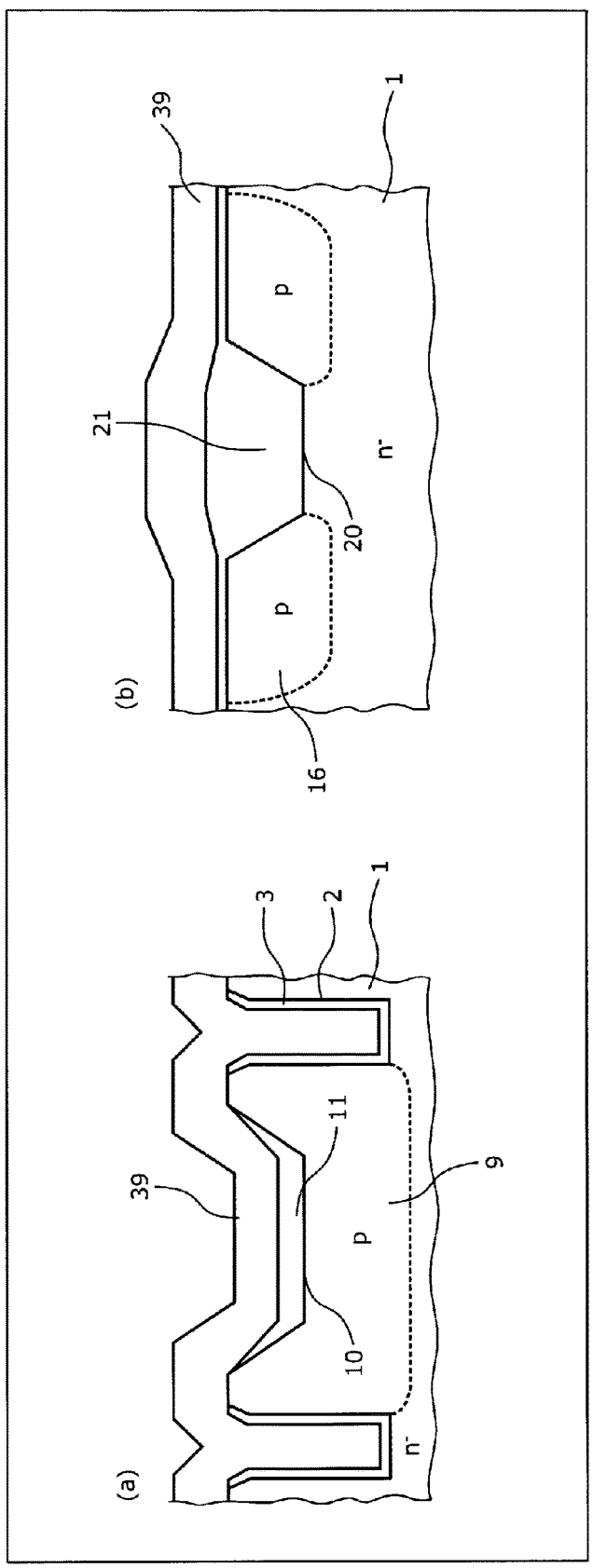
FIG. 16 is a sectional view showing a state partway through semiconductor device manufacture according to the third embodiment.

Next, a damage layer (not shown) formed on the inner wall of the trench 2 is removed by removing the sacrificial oxide film 38 formed on the inner wall of the trench 2. At this time, the thicknesses of the insulation layers 11 and 21 and screen oxide film 32 decrease by, for example, an amount equivalent to the thickness of the sacrificial oxide film 38. Next, the gate insulating film 3 is formed along the inner wall of the trench 2 using thermal oxidation, as shown in FIG. 16. Next, using etching, the insulation layer 11 is left to a predetermined thickness in depressed form so as to follow the inner wall of the groove 10 in the interior portion of the groove 10 of the active region. At this time, the insulation layer 11 is removed in such a way that the insulation layer 11 does not remain on the front surface of the floating p-type region 9 in a portion sandwiched between the trench 2 and the groove 10. Next, for example, a polysilicon layer 39 doped with an impurity is grown on the wafer front surface from the active region to the edge termination structure portion so as to be embedded in the interiors of the trench 2 and the groove 10.

Figure 17:
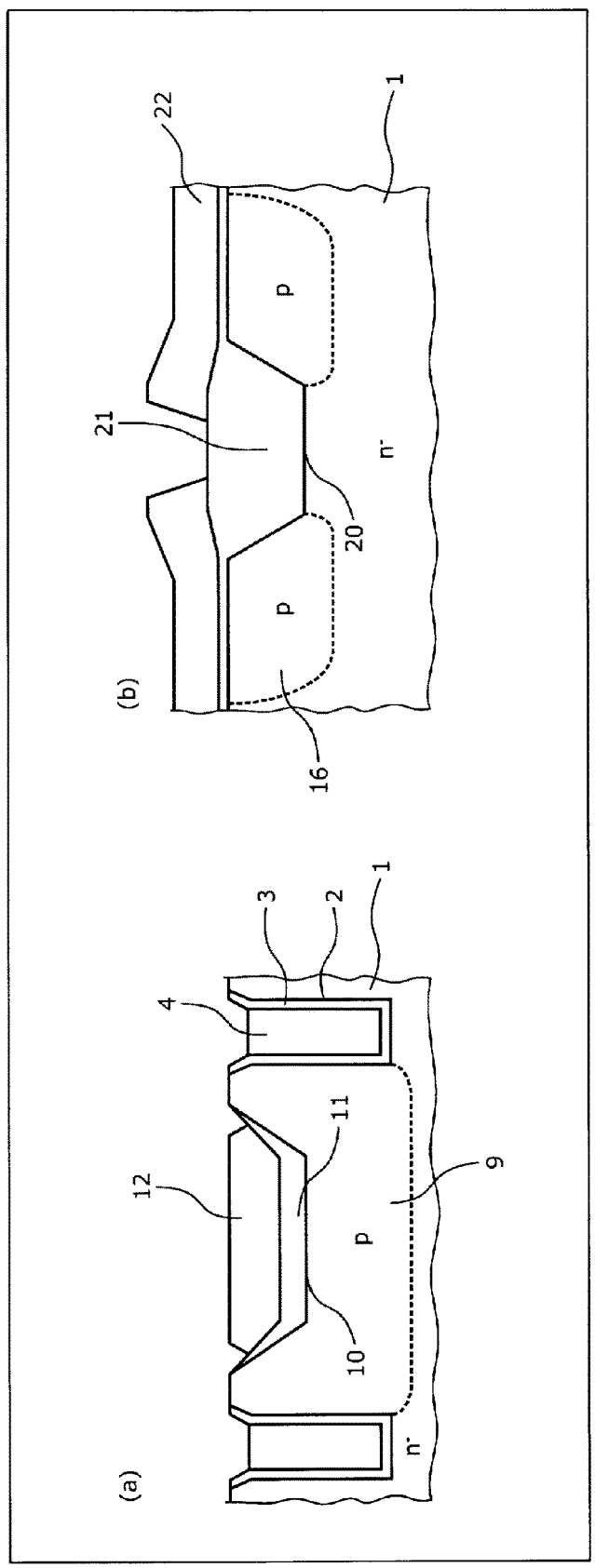
FIG. 17 is a sectional view showing a state partway through semiconductor device manufacture according to the third embodiment.

Next, as shown in FIG. 17, the polysilicon layer 39 is patterned using photolithography and plasma etching in such a way as to leave portions that form the first and second gate electrodes 4 and 12 in the active region, and a portion that forms the field plate 22 in the edge termination structure portion. At this time, the polysilicon layer 39 is patterned in such a way that the upper surface of the portion of the polysilicon layer 39 that forms the second gate electrode 12 is of practically the same height as the wafer front surface, and the portion of the polysilicon layer 39 that forms the second gate electrode 12 and the portion of the polysilicon layer 39 that forms the first gate electrode 4 are cut off. Next, using a general method, the interlayer dielectric 8 and emitter electrode 7 are formed on the wafer front surface, and the n-type field stop layer 13, the p$^-$-type collector layer 14, and the collector electrode 15 are formed on the wafer back surface. Subsequently, the semiconductor device according to the embodiment shown in FIGS. 1 and 2 is completed by the semiconductor wafer being cut (diced) into individual chip form.

According to the third embodiment, as heretofore described, the same advantages as in the first and second embodiments can be obtained.

Fourth Embodiment

Figure 18:
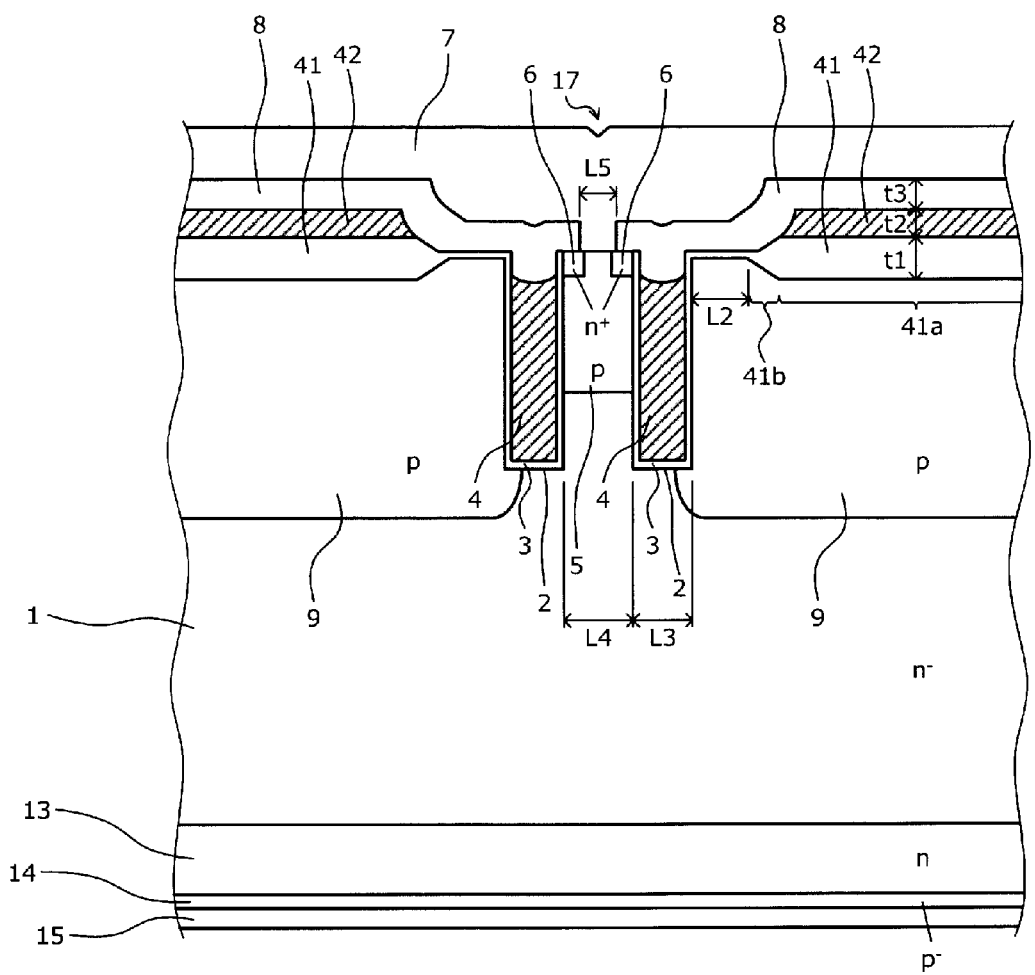
FIG. 18 is a sectional view showing the structure of an active region of a semiconductor device manufactured using a semiconductor device manufacturing method according to a fourth embodiment.
Figure 19:
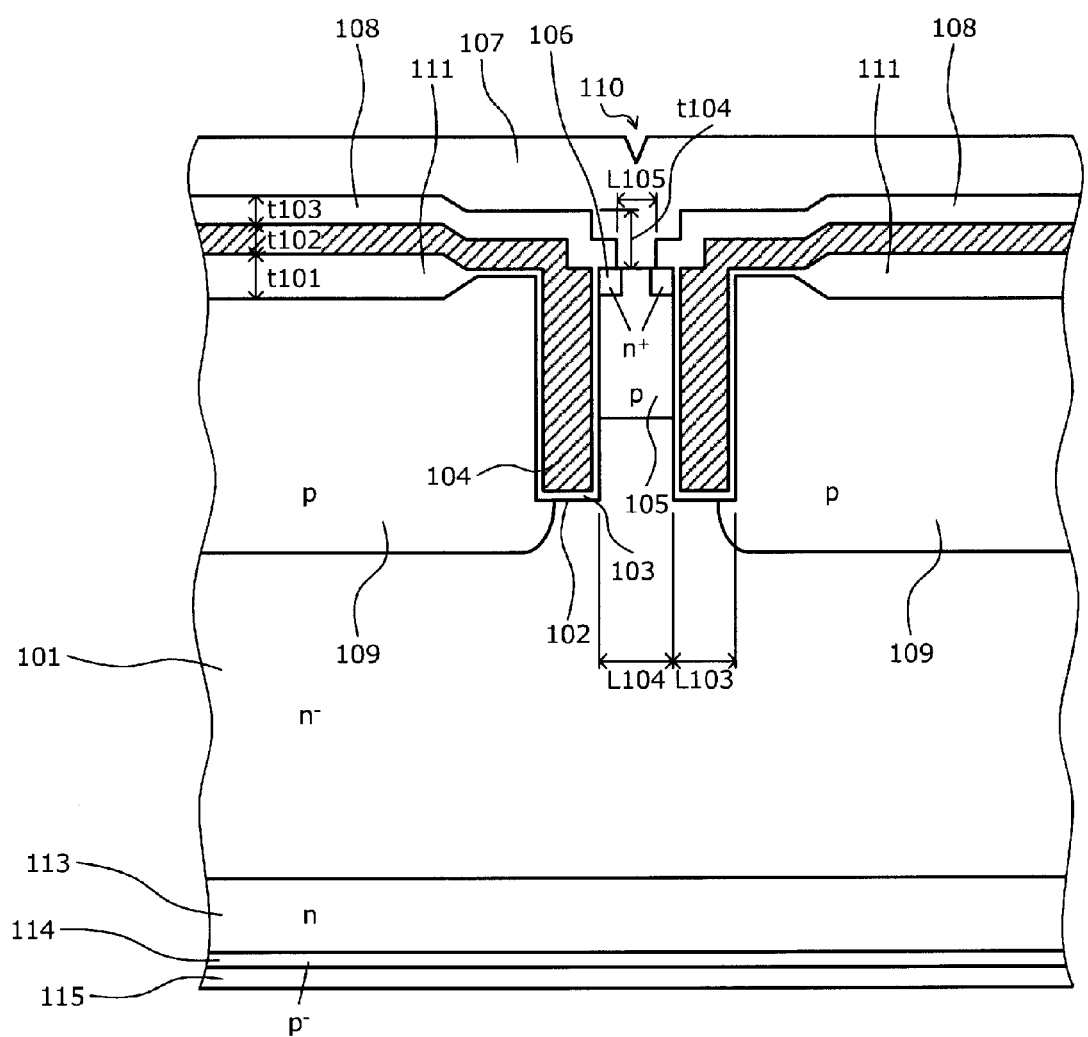
FIG. 19 is a sectional view showing the structure of an active region of an existing semiconductor device.

Next, a description will be given of a semiconductor device manufacturing method according to a fourth embodiment. FIG. 18 is a sectional view showing the structure of the active region of a semiconductor device manufactured using the semiconductor device manufacturing method according to the fourth embodiment. FIG. 19 is a sectional view showing the structure of the active region of an existing semiconductor device. FIGS. 20 to 26 are sectional views showing states partway through the semiconductor device manufacture according to the fourth embodiment. The semiconductor device manufacturing method according to the fourth embodiment differs from the semiconductor device manufacturing method according to the third embodiment in that etching is carried out in a state wherein a portion of a polysilicon layer 51 deposited on the front surface side of the n$^-$-type semiconductor wafer that forms a second gate electrode 42 is covered by a resist mask 52. Owing to the etching, the portion of the polysilicon layer 51 covered by the resist mask 52 remains, the vicinity of the trench 2, which is not covered by the resist mask 52, is removed in the same way as when etched back, and the portion that forms the first gate electrode 4 remains.

That is, the semiconductor device fabricated (manufactured) using the semiconductor device manufacturing method according to the fourth embodiment has a configuration wherein the first gate electrode 4 and the second gate electrode 42 are disposed apart, in the same way as the semiconductor device according to the first embodiment. The semiconductor device fabricated using the semiconductor device manufacturing method according to the fourth embodiment differs from the semiconductor device according to the first embodiment in the configurations of an insulation layer (a LOCOS film 41) on the floating p-type region 9 and the second gate electrode 42. Specifically, in the fourth embodiment, the LOCOS film 41 is formed in a flat surface state, without a groove being formed, on the substrate front surface side surface of the floating p-type region 9, as shown in FIG. 18. Further, step coverage of the interlayer dielectric 8 is improved by adjusting the positions of the LOCOS film 41 and the second gate electrode 42 with respect to the first gate electrode 4, whereby surface unevenness of the emitter electrode 7 is reduced.

An end portion (LOCOS bird's beak) 41b of the LOCOS film 41 is such that both the upper surface (interlayer dielectric 8 side surface) and lower surface (floating p-type region 9 side surface) are inclined, whereby the thickness decreases as the end portion 41b nears the trench 2 side. Specifically, the LOCOS bird's beak 41b is a portion that grows so as to burrow under the lower side of the mask of the LOCOS film 41, which is formed with a nitride film (for example, a silicon nitride (SiN) film) as a mask, and is a portion of a bird's beak form whose thickness decreases toward the outer side (as the portion nears the trench 2 side). Also, a portion of the LOCOS film 41 other than the LOCOS bird's beak 41b is a thick portion 41a whose thickness is greater than that of the LOCOS bird's beak 41b. The LOCOS film 41 is preferably disposed distanced from the trench 2 by a predetermined interval in the trench lateral direction. The reason for this is as follows. When forming the LOCOS film 41, defects occur in the floating p-type region 9 in the vicinity of the boundary with the LOCOS bird's beak 41b of the LOCOS film 41. When an interval (that is, the distance from the leading end of the LOCOS bird's beak 41b to the side wall on the floating p-type region 9 side of the trench 2) L2 between the LOCOS film 41 and the trench 2 is short, the quality of the gate insulating film 3 is adversely affected by defects occurring in the floating p-type region 9.

That is, the interval L2 between the LOCOS film 41 and trench 2 is preferably long enough that the quality of the gate insulating film 3 is not adversely affected by defects occurring in the floating p-type region 9 when forming the LOCOS film 41. Specifically, it is good when the interval L2 between the LOCOS film 41 and the trench 2 is greater than a thickness t1 (in the region of, for example, 0.8 μm) of the thicker thick portion 41a of the LOCOS film 41 (L2>t1). Meanwhile, when the interval L2 between the LOCOS film 41 and the trench 2 is too long, the advantage of improving controllability of the turn-on di/dt decreases. Therefore, the interval L2 between the LOCOS film 41 and the trench 2 may be, for example, within a range of in the region of 1.0 μm or more, 2.0 μm or less, as the distance on the mask used in the formation of the LOCOS film 41 (that is, the distance from the side wall of the mask aperture portion to the side wall on the floating p-type region 9 side of the trench 2). For example, when the distance on the mask is in the region of 2.0 μm, the interval L2 between the LOCOS film 41 and the trench 2 is in the region of 1.6 μm. The surface of a portion of the floating p-type region 9 sandwiched between the LOCOS 41 and the trench 2 is covered by the gate insulating film 3.

The second gate electrode 42 is provided on the thicker thick portion 41a of the LOCOS film 41, and does not extend over the LOCOS bird's beak 41b. The mirror capacitance can be prevented from increasing by not extending the second gate electrode 42 over the thinner LOCOS bird's beak 41b. Also, the second gate electrode 42 preferably covers the whole of the thick portion 41a of the LOCOS film 41 (that is, the portion of the LOCOS film 41 other than the LOCOS bird's beak 41b). The reason for this is that the greater the area of the floating p-type region 9 covered by the second gate electrode 42 across the LOCOS film 41, the further controllability of the turn-on di/dt can be improved. Although the thickness of an end portion of the second gate electrode 42 is less than the thickness of another portion of the second gate electrode 42 owing to a side surface of the second gate electrode 42 being of a tapered form, as will be described hereafter, controllability of the turn-on di/dt is not adversely affected.

By the LOCOS film 41 and second gate electrode 42 being provided in this way, the second gate electrode 42 and the LOCOS film 41 on the layer below the second gate electrode 42 are formed in a step form wherein the number of steps with respect to the substrate front surface decreases from the floating p-type region 9 side toward the trench 2 side. Also, the side surface of the second gate electrode 42 is of a tapered form inclined in the same direction as the inclination of the LOCOS bird's beak 41b, and gently joining the inclination of the LOCOS bird's beak 41b, owing to side etching that proceeds when the second gate electrode 42 is formed, as will be described hereafter. The inclination of the side surface of the second gate electrode 42 is preferably of the same extent as the inclination of the LOCOS bird's beak 41b, or gentler than the inclination of the LOCOS bird's beak 41b. Therefore, the surface unevenness of the interlayer dielectric 8 from the LOCOS bird's beak 41b to an element structure portion (a portion in which the p-type base region 5 and n$^+$-type emitter region 6 are formed) decreases, whereby the flatness of the interlayer dielectric 8 is increased.

For example, a previously existing structure (refer to FIG. 19) is such that a gate electrode 104 is formed so as to extend above the surface of a floating p-type region 109 from the interior portion of a trench 102, because of which the surface unevenness of an interlayer dielectric 108 increases in the vicinity of the element structure portion. Therefore, focusing within the plane of the wafer is partially difficult when exposing the interlayer dielectric 108 to light during photolithography for forming a contact hole, because of which the transfer accuracy of the mask pattern decreases. Therefore, there is concern that a pattern failure caused by surface unevenness of the interlayer dielectric 108 in the vicinity of the element structure portion will occur, and formation of an intricate pattern in the vicinity of the contact between an emitter electrode 107 and a semiconductor portion will become difficult. Also, when the surface unevenness of the interlayer dielectric 108 in the element structure portion is large, a step t104 from the surface of the semiconductor portion exposed in the contact hole to the surface of the interlayer dielectric 108 increases. In FIG. 19, reference signs 101, 103, 106, and 113 to 115 are an n$^-$-type drift layer, a gate insulating film, an n$^+$-type emitter region, an n-type field stop layer, a p$^-$-type collector layer, and a collector electrode respectively.

In the heretofore described existing structure, the dimensions of the element structure are such that, for example, a width (the width in the trench lateral direction, the same applying hereafter) L103 of the trench 102 is 1.2 μm, a width L104 of a p-type base region 105 is 2 μm, a width L105 of the contact hole is 1 μm, and a thickness t101 of a LOCOS film 111 is 0.8 μm. In this case, a thickness t102 of a portion of the gate electrode 104 above the floating p-type region 109 is 0.8 μm, and a thickness t103 of the interlayer dielectric 108 is 1 μm. Therefore, the step t104 from the surface of the semiconductor portion to the surface of the interlayer dielectric 108 in the element structure portion is in the region of approximately 1.8 μm, which is in the region of twice the width L105 of the contact hole. Therefore, a depression 110 in the surface of the emitter electrode 107 in the element structure portion increases, a large stress is exerted on the emitter electrode 107 in a contact portion between the portion of the surface of the emitter electrode 107 in which the depression 110 is formed and a wire (not shown) when assembling the product, and a wire bonding failure such as cracking is liable to occur. There is concern that power cycle resistance will decrease as a result of this.

As opposed to this, in the fourth embodiment, the LOCOS film 41 and the second gate electrode 42 are formed in step form distanced from the trench 2, as heretofore described, because of which the surface unevenness of the interlayer dielectric 8 in the element structure portion can be reduced. Therefore, even when each of a thickness t2 of the second gate electrode 42, thickness t3 of the interlayer dielectric 8, and dimensions of the element structure (a width L3 of the trench 2, width L4 of the p-type base region 5, and width L5 of the contact hole) are the same as the corresponding portions of the existing structure, the surface unevenness of the interlayer dielectric 8 in the element structure portion is reduced in comparison with the existing structure. Consequently, an intricate pattern can be formed in the vicinity of the contact between the emitter electrode 7 and the semiconductor portion. Also, by the surface unevenness of the interlayer dielectric 8 in the element structure portion being reduced, a surface unevenness 17 of the emitter electrode 7 in the element structure portion decreases, and the flatness of the surface of the emitter electrode 7 increases. Therefore, the heretofore described problem occurring when the depression 110 in the surface of the emitter electrode 107 is large, as in the existing structure, is alleviated.

Figure 20:
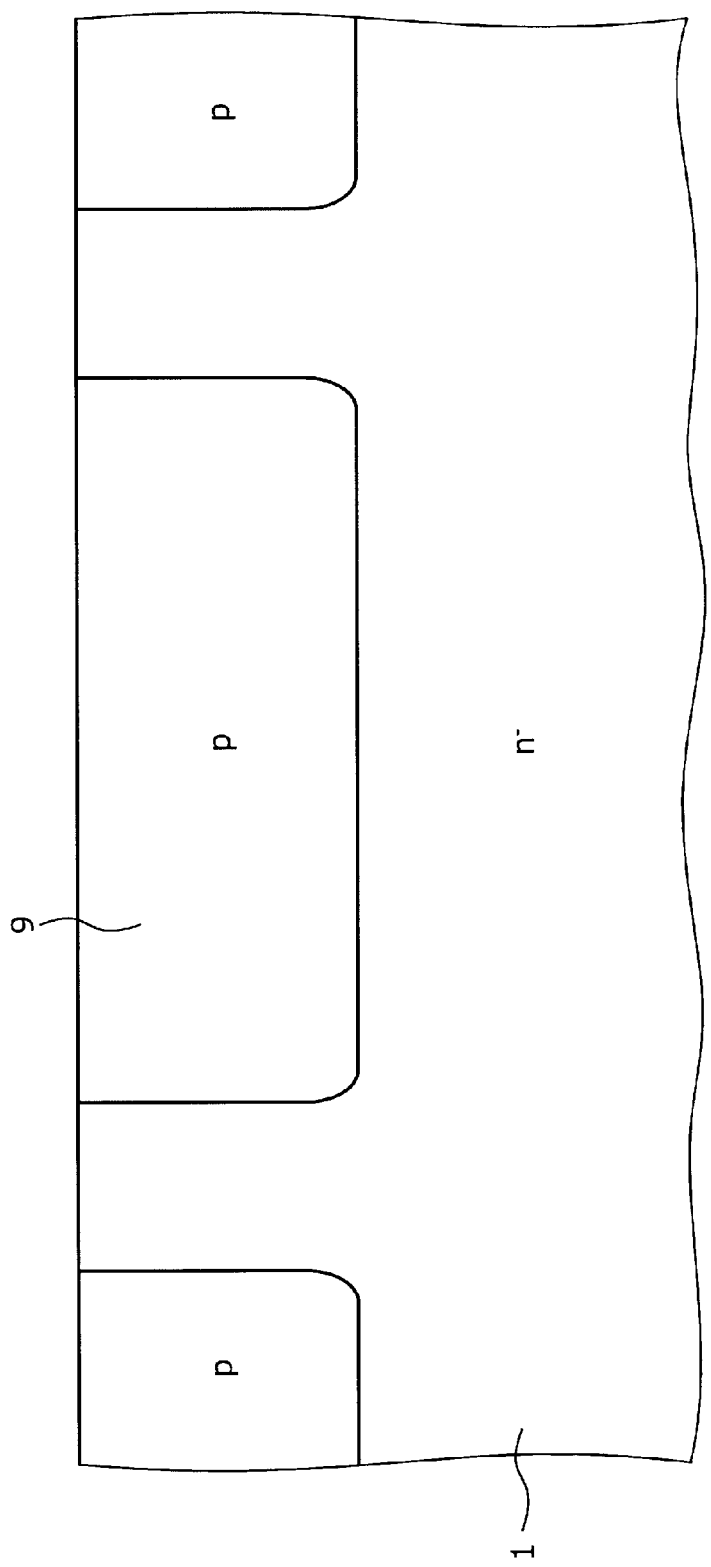
FIG. 20 is a sectional view showing a state partway through semiconductor device manufacture according to the fourth embodiment.
Figure 21:
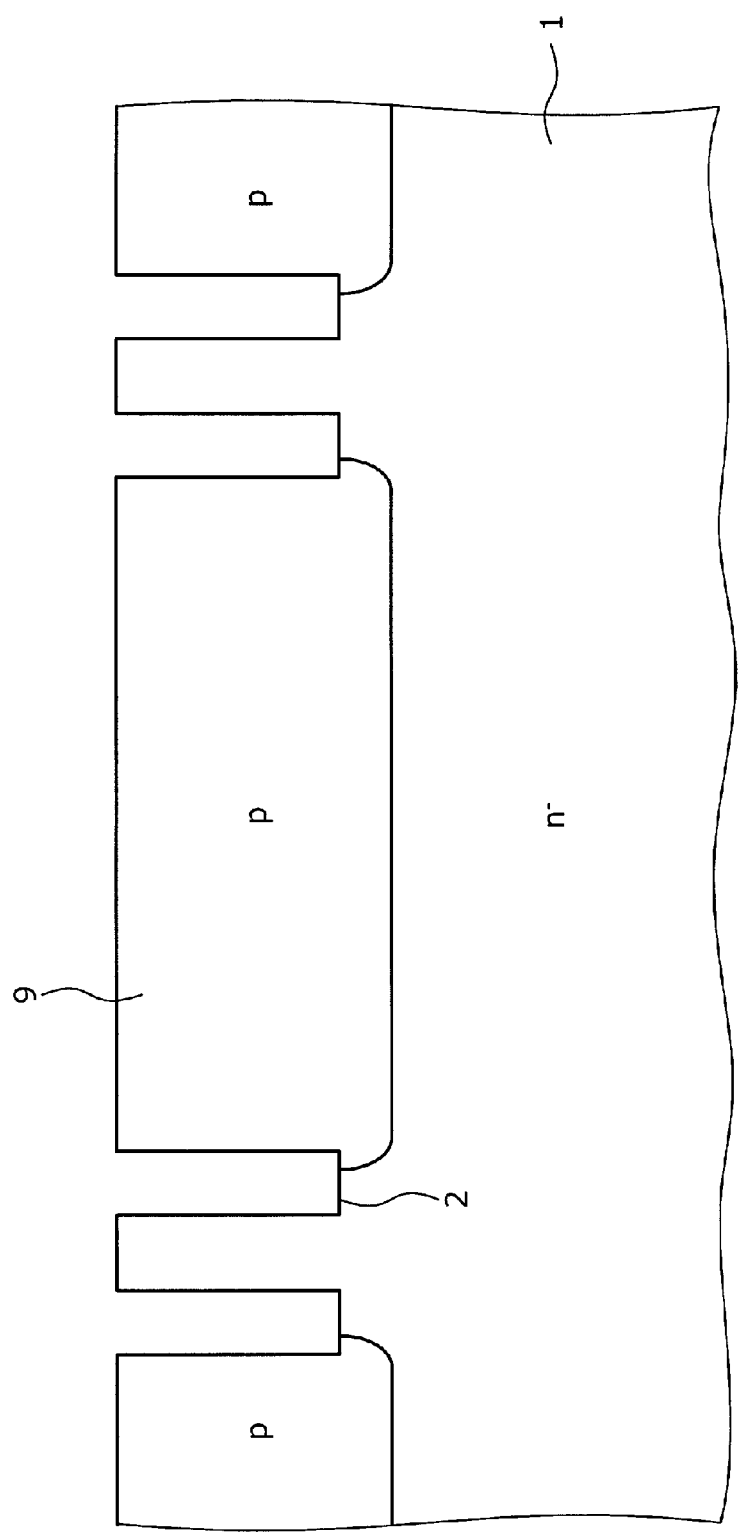
FIG. 21 is a sectional view showing a state partway through semiconductor device manufacture according to the fourth embodiment.

When fabricating the semiconductor device according to the fourth embodiment shown in FIG. 18, firstly, an n⁻-type semiconductor wafer (hereafter referred to as the n⁻-type semiconductor wafer 1) that forms the n⁻-type drift layer 1 is prepared, as shown in FIG. 20. The conditions of the n⁻-type semiconductor wafer 1 may be the same as in the third embodiment. Next, using photolithography and ion implantation, the floating p-type region 9 is selectively formed in a surface layer of the front surface of the n⁻-type semiconductor wafer 1. Next, the trench 2 is formed using photolithography and etching, as shown in FIG. 21. A multiple of trenches 2 are formed on both sides of the floating p-type region 9 so as to sandwich the floating p-type region 9, and along the boundary between the floating p-type region 9 and n⁻-type drift layer, to a depth less than that of the floating p-type region 9 in the depth direction.

Figure 22:
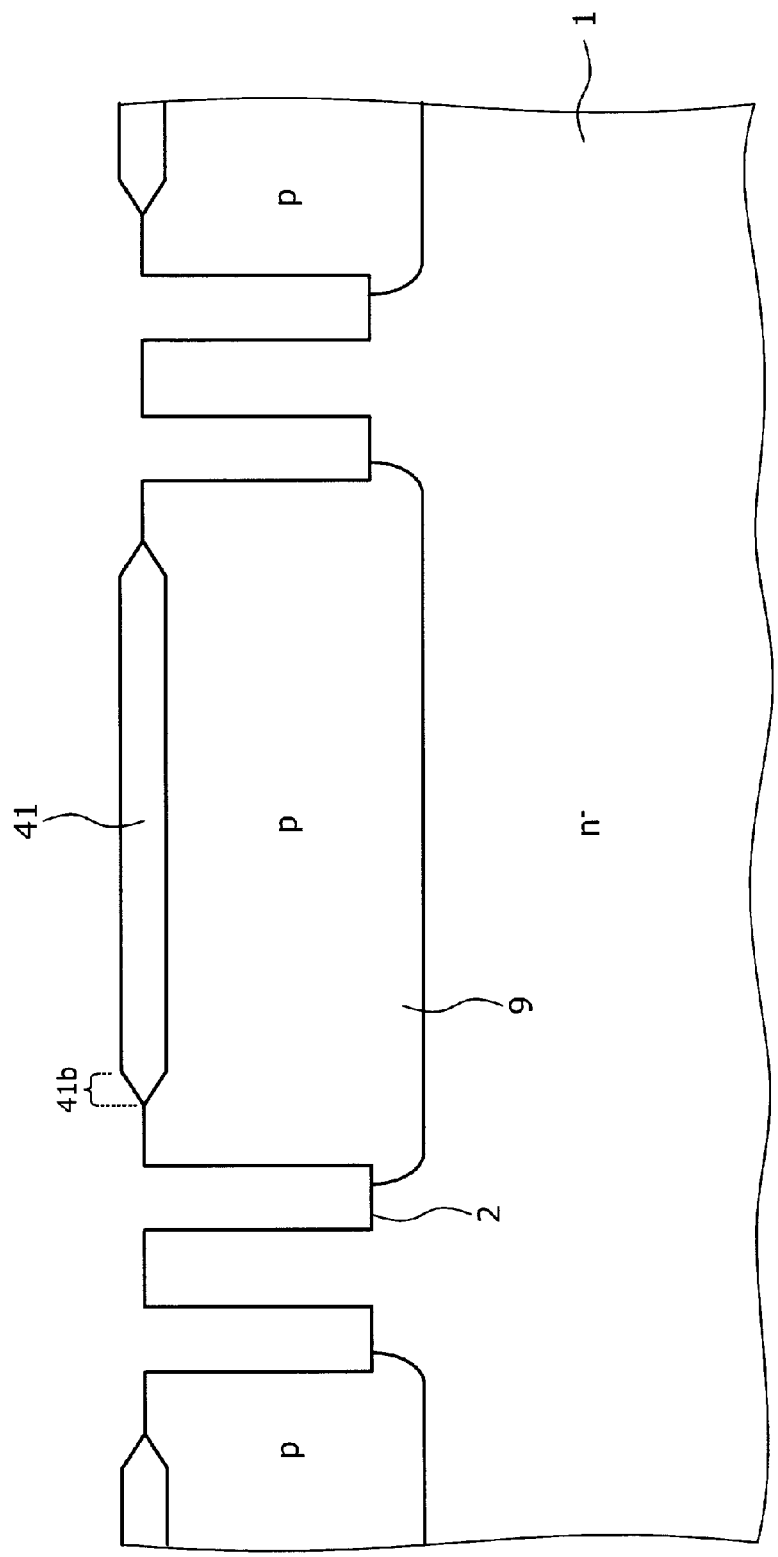
FIG. 22 is a sectional view showing a state partway through semiconductor device manufacture according to the fourth embodiment.
Figure 23:
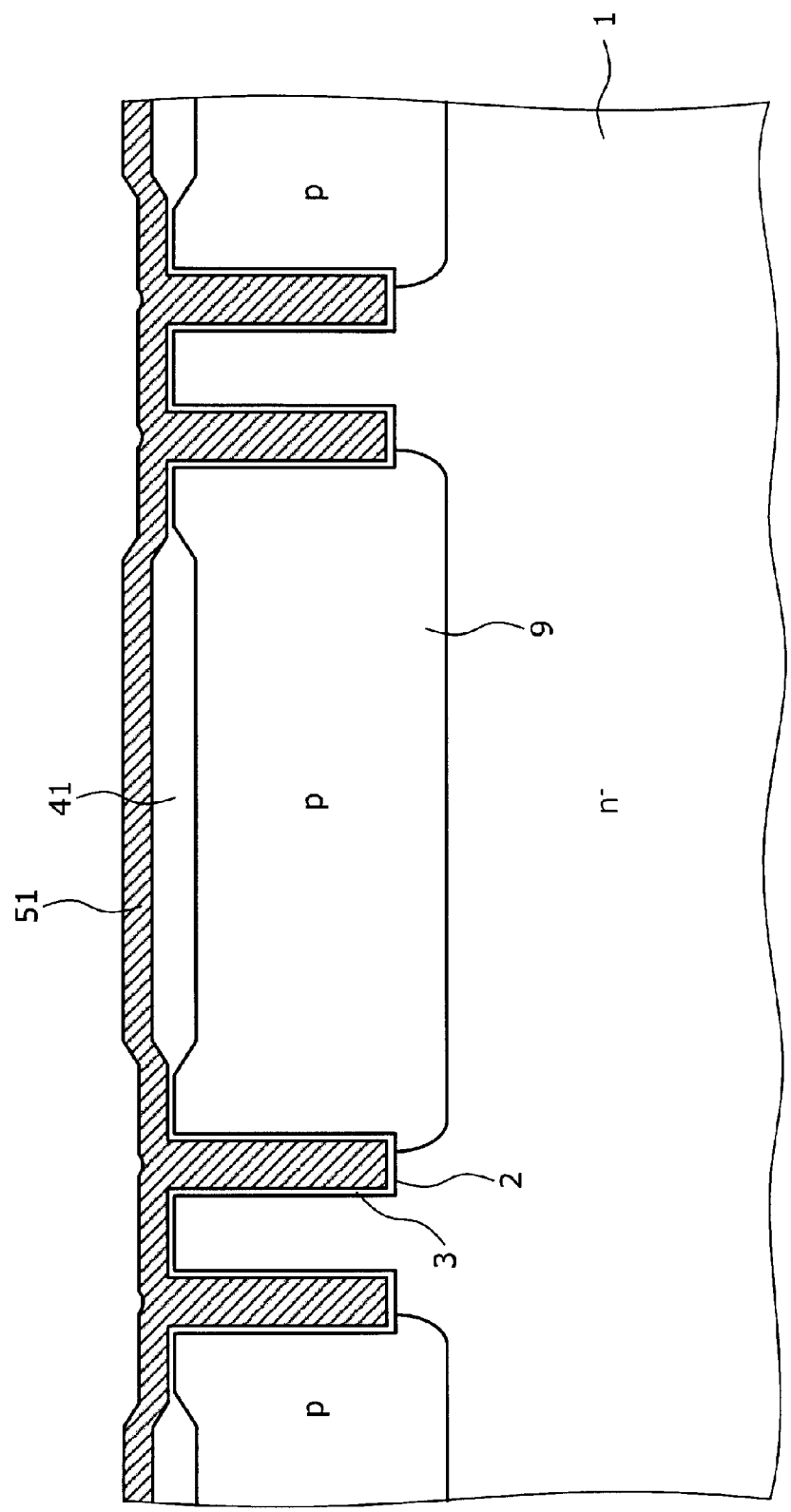
FIG. 23 is a sectional view showing a state partway through semiconductor device manufacture according to the fourth embodiment.

Next, a nitride film (not shown) is formed on the wafer front surface. Next, the nitride film is selectively removed using photolithography and etching, thereby exposing a portion of the floating p-type region 9 corresponding to a formation region of the LOCOS film 41. Next, with the remainder of the nitride film as a mask, the LOCOS film 41 is formed in the exposed portion of the floating p-type region 9 using, for example, pyrogenic oxidation (a thermal process), as shown in FIG. 22. At this time, an end portion of the LOCOS film 41 grows so as to burrow under the lower side of the mask, forming the LOCOS bird's beak 41b. Next, the nitride film used as a mask is removed. Next, the gate insulating film 3 is formed along the exposed portion of the wafer front surface (that is, the portion in which the LOCOS film 41 is not formed) and inner wall of the trench 2, as shown in FIG. 23. Next, the polysilicon layer 51 is formed on the LOCOS film 41 and the gate insulating film 3 so as to fill the interior portion of the trench 2.

Figure 24:
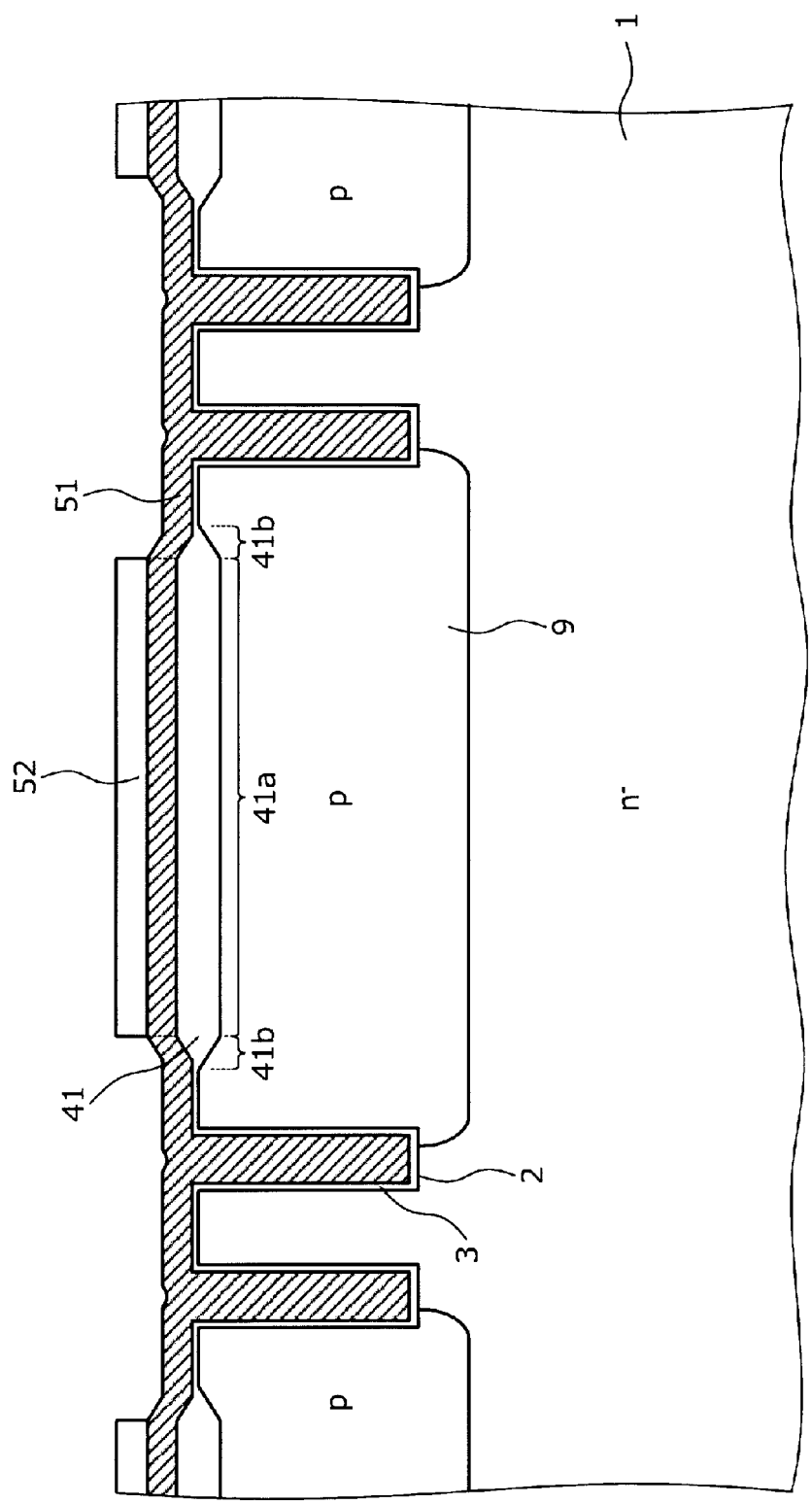
FIG. 24 is a sectional view showing a state partway through semiconductor device manufacture according to the fourth embodiment.
Figure 25:
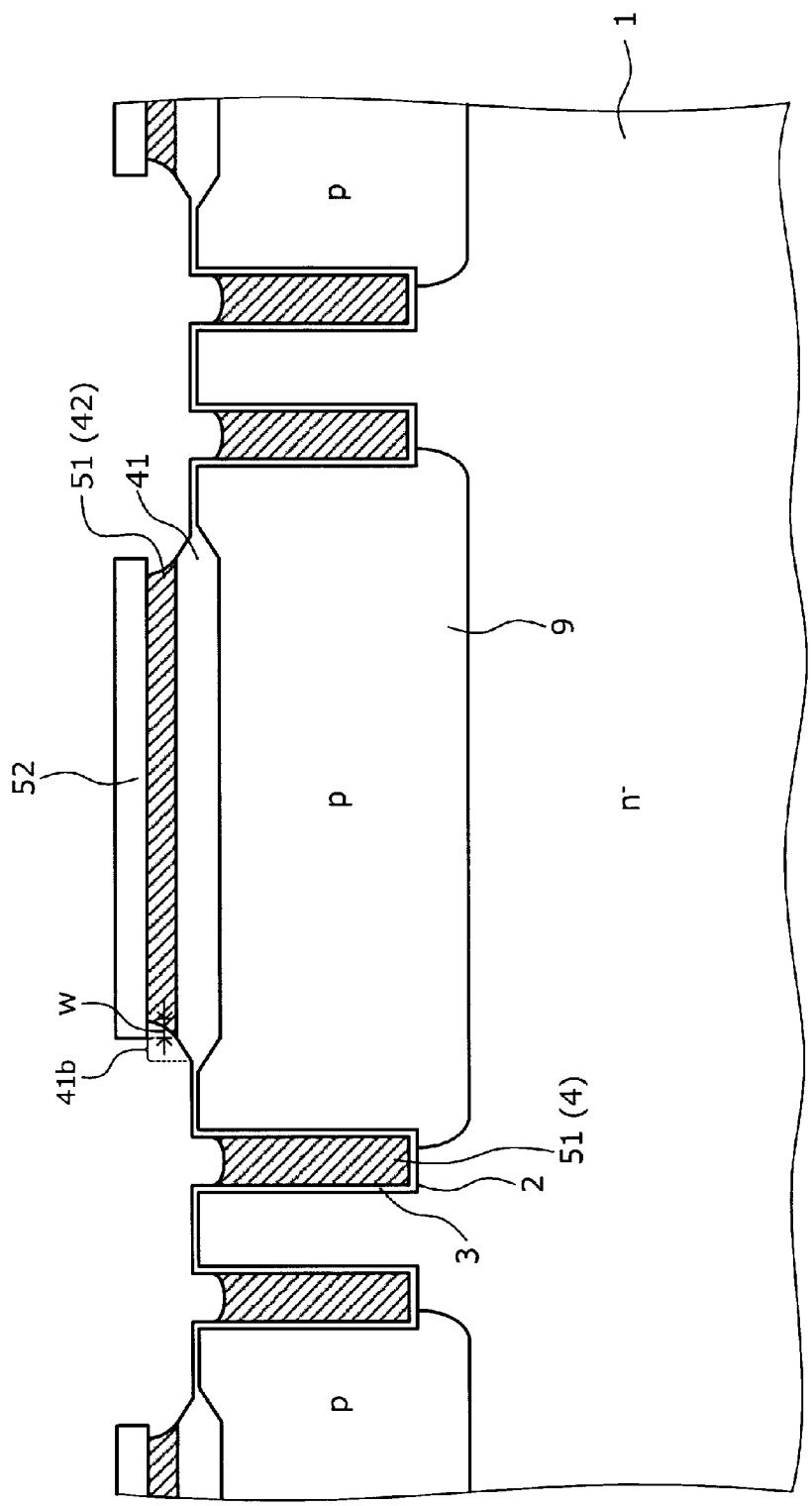
FIG. 25 is a sectional view showing a state partway through semiconductor device manufacture according to the fourth embodiment.

Next, a resist mask 52 that covers the whole of the portion of the polysilicon layer 51 on the thick portion 41a of the LOCOS film 41 is formed, as shown in FIG. 24. Next, anisotropic dry etching is carried out with the resist mask 52 as a mask, thereby selectively removing the polysilicon layer 51, as shown in FIG. 25. Therefore, a portion to the trench 2 side of the LOCOS bird's beak 41b (the element structure portion) is in the same state as when etching back is carried out, with the portion being exposed from the LOCOS bird's beak 41b to the element structure portion, and the polysilicon layer 51 remaining in the interior portion of the trench 2. Also, the portion of the polysilicon layer 51 covered by the resist mask 52, not being removed, also remains so as to cover the whole of the thick portion 41a of the LOCOS film 41. The portion of the polysilicon layer 51 remaining in the interior portion of the trench 2 forms the first gate electrode 4, while the portion remaining on the thick portion 41a of the LOCOS film 41 forms the second gate electrode 42.

Also, when this etching is carried out, the etching (side etching) proceeds to a predetermined width w in a direction (lateral direction) perpendicular to the depth direction in an end portion of the portion of the polysilicon layer 51 on the thick portion 41a of the LOCOS film 41 (the portion that forms the second gate electrode 42) along the boundary with the resist mask 52. As polysilicon has good step coverage, the side surface of the second gate electrode 42 is of a tapered form whose thickness gradually decreases on nearing the element structure portion side owing to the side etching, while the state wherein the whole of the thick portion 41a of the LOCOS film 41 is covered by the second gate electrode 42 is maintained. That is, the second gate electrode 42 is of an approximately trapezoidal sectional form wherein the lower surface (the interface with the LOCOS film 41) is wider than the upper surface (the interface with the emitter electrode 7, to be described hereafter). At this time, it is preferable that the side surface of the second gate electrode 42 is tapered to gently join the inclination of the LOCOS bird's beak 41b by the etching conditions being variously changed.

Figure 26:
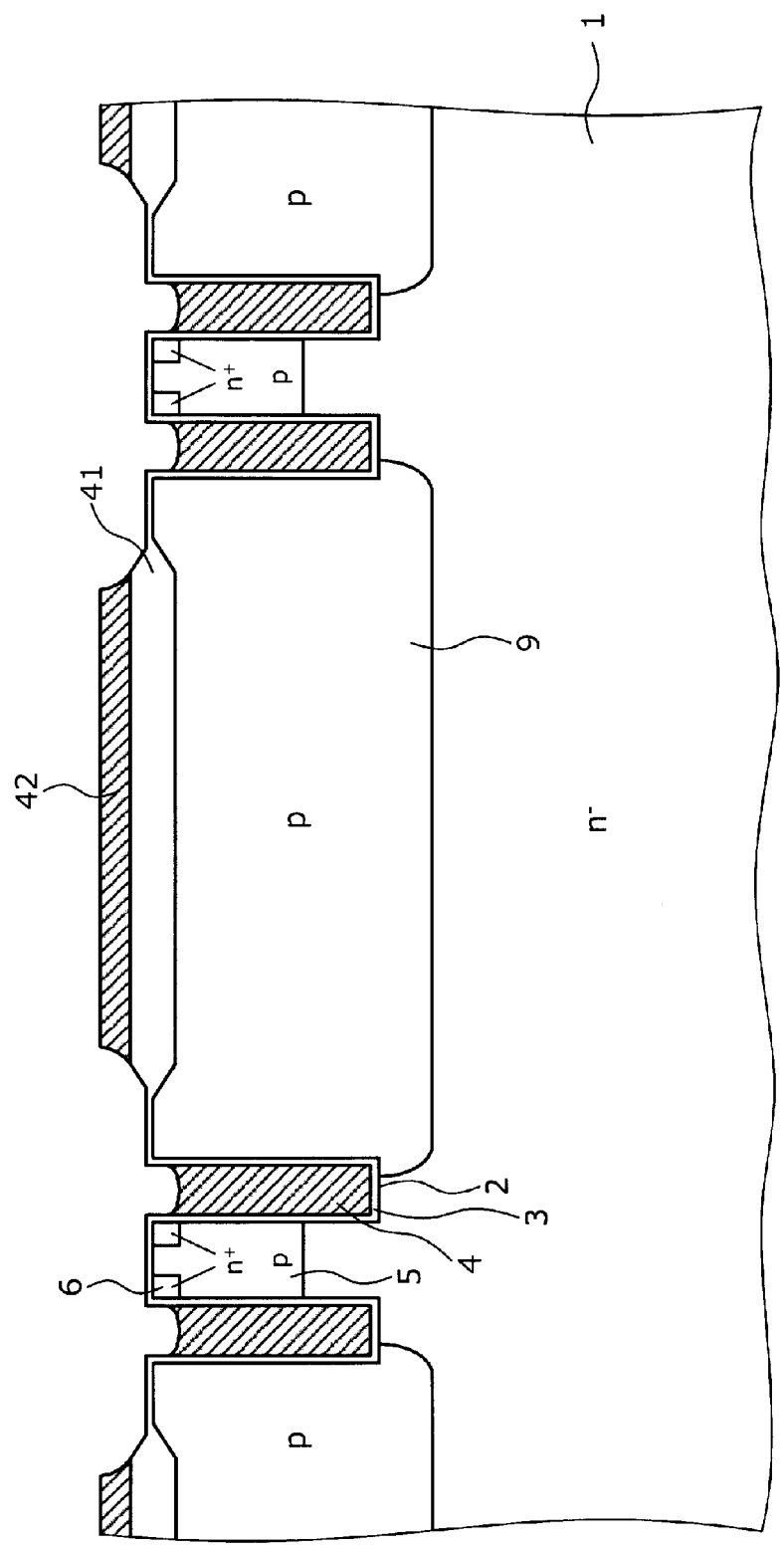
FIG. 26 is a sectional view showing a state partway through semiconductor device manufacture according to the fourth embodiment.

Also, the portion of the polysilicon layer 51 that forms the second gate electrode 42 is extended as far as the edge termination structure portion (not shown), and left so as to be disposed on the lower side (n⁻-type drift layer side) of a gate runner (not shown) formed in a subsequent step. That is, when etching the polysilicon layer 51, it is sufficient that etching is carried out in a state wherein a portion of the polysilicon layer 51 corresponding to a formation region of the gate runner (the portion of the polysilicon layer 51 wished to be left) is covered by the resist mask 52. The configuration of the vicinity of the gate runner in the fourth embodiment will be described hereafter. Next, after the resist mask 52 is removed, the p-type base region 5 and n⁺-type emitter region 6 are selectively formed using a general method in a portion of the n⁻-type drift layer sandwiched by the floating p-type region 9, as shown in FIG. 26. A p⁺-type contact region (not shown) may be selectively formed in the interior portion of the p-type base region 5. Next, the interlayer dielectric 8 is formed on the wafer front surface.

Next, the interlayer dielectric 8 and gate insulating layer 3 are selectively removed, thereby forming contact holes. The p-type base region 5 and n⁺-type emitter region 6 are selectively exposed in a contact hole formed in the active region. The second gate electrode 42 is selectively exposed in a contact hole formed in the vicinity of the boundary between the active region and the edge termination structure portion. Next, the emitter electrode 7 in contact with the p-type base region 5 and n⁺-type emitter region 6, and a gate runner in contact with the second gate electrode 42, are formed on the wafer front surface side. The emitter electrode 7 and gate runner are simultaneously formed by, for example, patterning an electrode layer formed of aluminum (Al) deposited on the wafer front surface. Also, the n-type field stop layer 13, p⁻-type collector layer 14, and collector electrode 15 are formed using a general method on the wafer back surface side. Subsequently, the semiconductor device shown in FIG. 18 is completed by the semiconductor wafer being cut into individual chip form.

Figure 27:
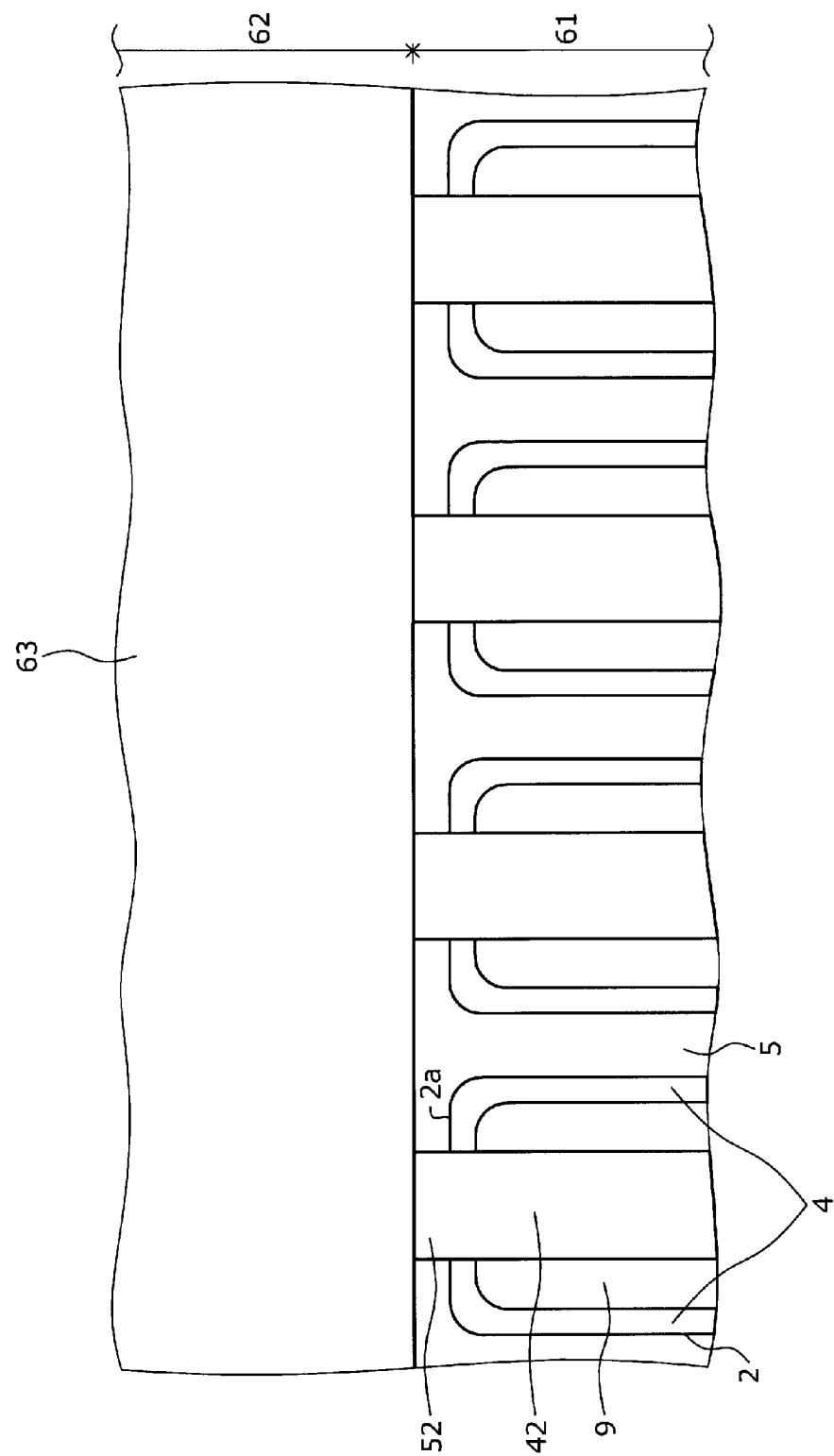
FIG. 27 is a plan view schematically showing an example of the vicinity of an edge termination structure portion of the semiconductor device according to the fourth embodiment.
Figure 28:
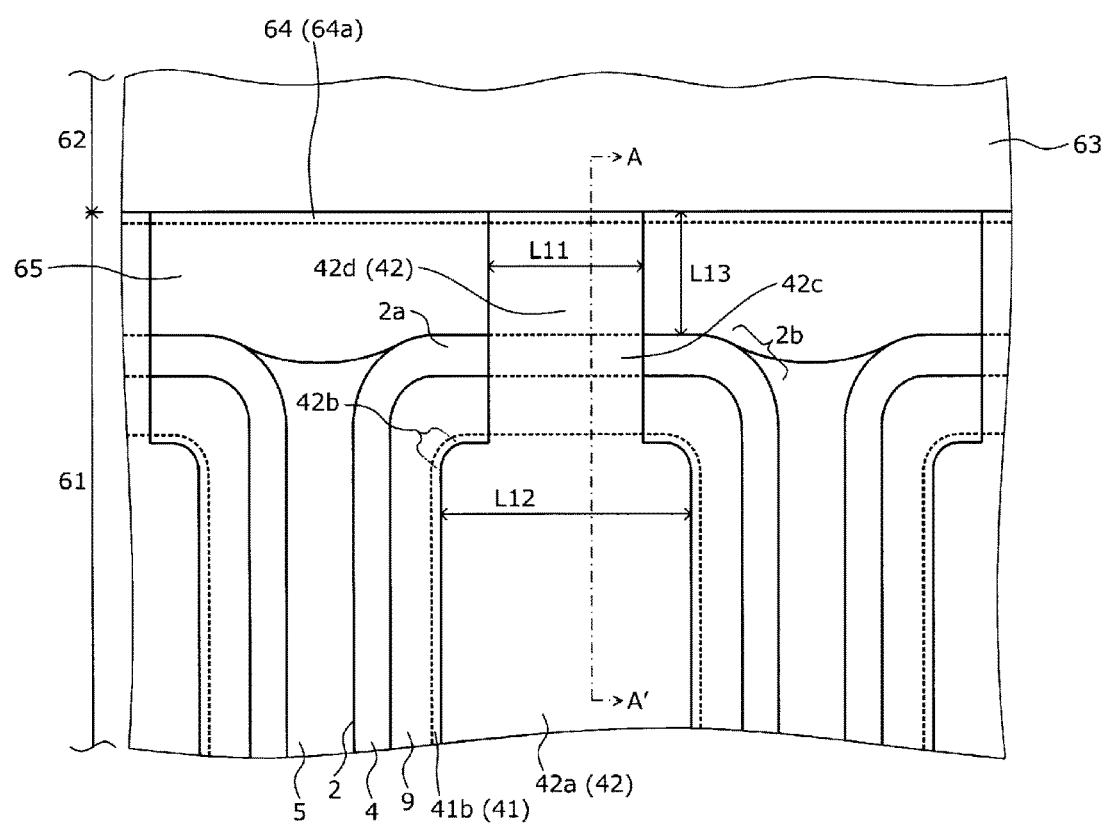
FIG. 28 is a plan view showing an enlargement of one portion of FIG. 27.
Figure 29:
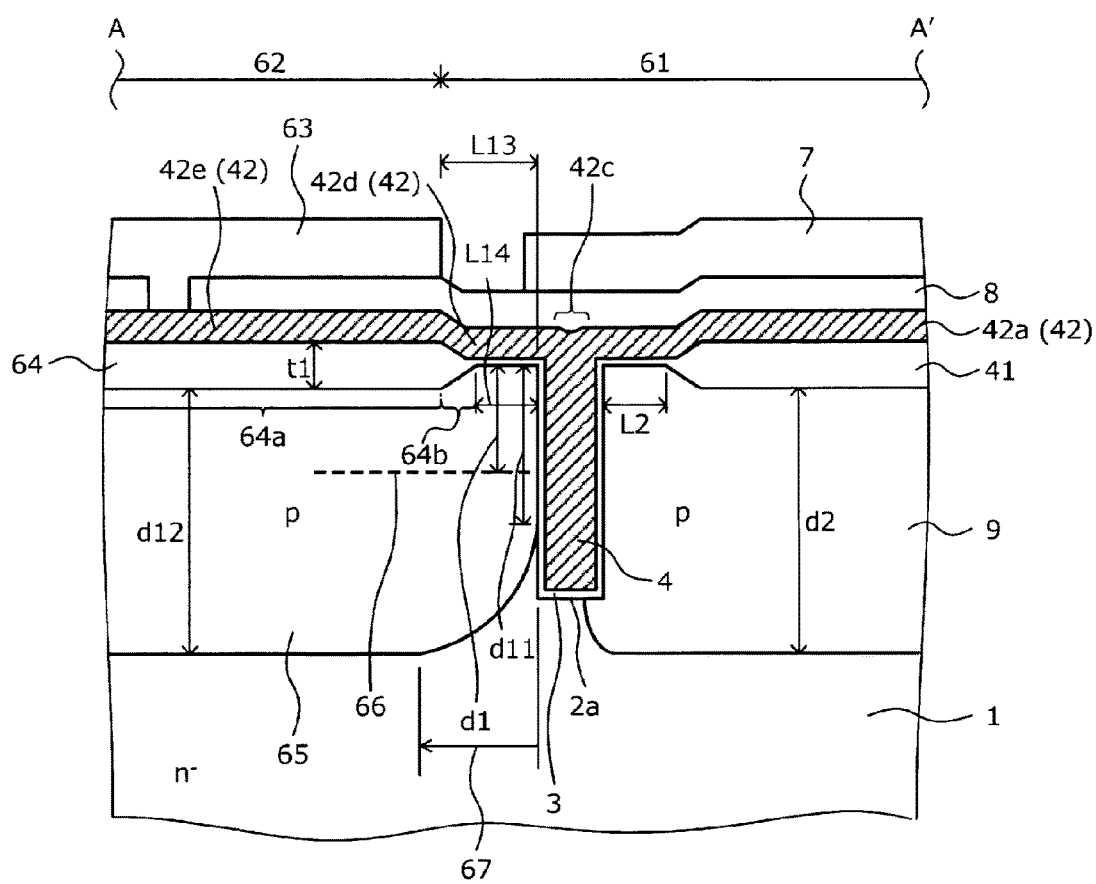
FIG. 29 is a sectional view showing a sectional structure along a cutting line A-A' of FIG. 28.

Next, the configuration of the vicinity of the gate runner will be described. FIG. 27 is a plan view schematically showing an example of the vicinity of the edge termination structure portion of the semiconductor device according to the fourth embodiment. FIG. 28 is a plan view showing an enlargement of one portion of FIG. 27. FIG. 29 is a sectional view showing a sectional structure along a cutting line A-A' of FIG. 28. FIGS. 27 and 28 show a planar layout of the first and second gate electrodes 4 and 42 and a gate runner (gate wire) 63, wherein the gate insulating film 3, n⁺-type emitter region 6, emitter electrode 7, and interlayer dielectric 8 are omitted from the drawings. The gate runner 63 is disposed in an approximately rectangular ring form enclosing the periphery of an active region 61 in the vicinity of the boundary between the active region 61 and an edge termination structure portion 62. A LOCOS film 64, for example, may be disposed distanced from a coupled trench 2a, to be described hereafter, on the lower side of the gate runner 63, in the same way as the LOCOS film 41 on the floating p-type region 9.

As shown in FIGS. 27 and 28, trenches 2 neighboring across the floating p-type region 9 in the active region 61 are such that opposing end portions are coupled, forming an approximately rectangular ring form planar form enclosing the periphery of the floating p-type region 9. The second gate electrode 42, for example, is disposed in stripe form extending in a direction parallel to the trench longitudinal direction, and so as to intersect the coupled portion (hereafter referred to as the coupled trench) 2a of neighboring trenches 2 coupled in approximately rectangular ring form, and extends as far as the edge termination structure portion 62. The second gate electrode 42 is in contact with the first gate electrode 4 in an intersection 42c with the coupled trench 2a. The second gate electrode 42 is preferably disposed distanced from a corner portion 2b of trenches 2 forming an approximately rectangular ring form. The reason for this is that an electrical field at the corner portion 2b of the trench 2 can be prevented from being applied to the second gate electrode 42.

A width L11 of a portion (hereafter referred to as the bridge portion) 42d on the outer side (edge termination structure portion 62 side) of the second gate electrode 42, including the intersection 42c with the coupled trench 2a, may be less than a width L12 of a portion 42a on the floating p-type region 9 (L11<L12). In this case, the planar form of the portion 42a of the second gate electrode 42 on the floating p-type region 9 is preferably an approximately rectangular form wherein a corner portion 42b is of an arc form. The reason for this is that an electrical field concentration in the corner portion 42b of the portion 42a of the second gate electrode 42 on the floating p-type region 9 can be relaxed. The planar form of the LOCOS film 41 disposed on the floating p-type region 9 may also be an approximately rectangular form wherein a corner portion is of an arc form, in the same way as the portion 42a of the second gate electrode 42 on the floating p-type region 9. In FIG. 29, the outer periphery of the LOCOS film 41 disposed on the floating p-type region 9 is indicated by a broken line following the portion 42a of the second gate electrode 42 on the floating p-type region 9 (the same also applies to FIG. 30).

By the width L11 of the bridge portion 42d of the second gate electrode 42 being less than the width L12 of the portion 42a on the floating p-type region 9, as heretofore described, the second gate electrode 42 can easily be distanced from the corner portion 2b of the trench 2. Furthermore, the bridge portion 42d of the second gate electrode 42 is disposed on the substrate front surface across, for example, the thin gate insulating film 3. Therefore, the parasitic capacitance (emitter-gate capacitance) between the bridge portion 42d of the second gate electrode 42 and the substrate can be prevented from increasing by reducing the width L11 of the bridge portion 42d of the second gate electrode 42. Also, the second gate electrode 42 extends to the lower side (the n⁻-type drift layer side) of the gate runner 63 across the interlayer dielectric 8. That is, the planar form of the portion (not shown) of the second gate electrode 42 disposed on the lower side of the gate runner 63 is an approximately rectangular ring form following the gate runner 63.

The gate runner 63 is disposed further to the outer side than the coupled trench 2a. An interval L13 between the gate runner 63 and coupled trench 2a is preferably greater than a thickness t1 of a thick portion 64a of the LOCOS film 64 (L13>t1). The reason for this is as follows. The gate runner 63 is preferably disposed on the LOCOS film 64 across the second gate electrode 42 and the interlayer dielectric 8. In FIG. 29, the outer periphery of the LOCOS film 64 on the lower side of the gate runner 63 is indicated by a broken line following the outer periphery of the gate runner 63. An interval L14 between the LOCOS film 64 on the lower side of the gate runner 63 and the coupled trench 2a is of the same extent as the interval L2 between the LOCOS film 41 disposed on the floating p-type region 9 and the trench 2 (L14=L2). Therefore, the film thickness of the coupled trench 2a can be prevented from being adversely affected by defects occurring when forming the LOCOS film 64, in the same way as in the vicinity of the trench 2 of the active region 61, and the surface unevenness of the interlayer dielectric 8 in the edge termination structure portion 62 can be reduced.

That is, the interval L13 between the gate runner 63 and the coupled trench 2a is determined based on the interval L14 between the LOCOS film 64 on the lower side of the gate runner 63 and the coupled trench 2a. Also, the end portion position in the trench longitudinal direction of the p-type base region 5 is determined in accordance with the interval L13 between the gate runner 63 and the coupled trench 2a. The reason for this is as follows. The second gate electrode 42 is formed before the p-type base region 5, and acts as a mask when carrying out an ion implantation for forming the p-type base region 5. The position of the second gate electrode 42 with respect to the coupled trench 2a is practically the same as that of the gate runner 63, because of which, depending on the disposition of the gate runner 63, the second gate electrode 42 overlaps the coupled trench 2a or is formed in a position near the coupled trench 2a. In this case, the ion implantation for forming the p-type base region 5 is blocked by the second gate electrode 42 in the vicinity of the coupled trench 2a.

By the LOCOS film 64 being provided on the lower side of the gate runner 63, as heretofore described, the parasitic capacitance (emitter-gate capacitance) between the gate runner 63 and the substrate can be prevented from increasing, even when a p-type region (hereafter referred to as the emitter p-type region) 65 of emitter potential is provided on the lower side of the LOCOS film 64. The emitter p-type region 65 extends inward (to the active region 61 side) as far as a position reaching a side wall on the outer side of the coupled trench 2a. Therefore, the n⁻-type drift layer 1 is not exposed between the bridge portions 42d of neighboring second gate electrodes 42, because of which an electrical field in the vicinity of the coupled trench 2a can be relaxed. The n⁻-type drift layer 1 may be exposed between the emitter p-type region 65 and p-type base region 5 inward of the side wall on the outer side of the coupled trench 2a. Also, the gate runner 63 is preferably disposed above the thick portion 64a of the LOCOS film 64. The reason for this is that the parasitic capacitance between the gate runner 63 and the substrate can be prevented from increasing by the gate runner 63 not being provided on the thin LOCOS bird's beak 64b.

As shown in FIG. 29, the emitter p-type region 65 is selectively provided in a surface layer of the n⁻-type drift layer 1 outward of the coupled trench 2a. The emitter p-type region 65 is provided so as to reach the coupled trench 2a in the trench longitudinal direction, and is in contact with the gate insulating film 3 provided on the side wall of the coupled trench 2a. The emitter p-type region 65 is isolated from the floating p-type region 9 by the coupled trench 2a. Depths d11 and d12 of the emitter p-type region 65 are preferably greater than a depth d1 (the depth indicated by a broken line 66) of the p-type base region 5. The reason for this is that as the electrical field intensity of the p-type base region 5 can be lower than the electrical field intensity of the emitter p-type region 65, the electrical field intensity in the active region 61 can be lower than the electrical field intensity of the edge termination structure portion. Also, the depth d11 of the emitter p-type region 65 at the interface with the gate insulating film 3 provided on the side wall on the outer side of the coupled trench 2a is preferably as small as possible. The reason for this is that the product being fabricated in a state wherein the emitter p-type region 65 and floating p-type region 9 are in contact can be avoided.

Specifically, the depth d11 of the emitter p-type region 65 may be, for example, of the extent of the depth d1 of the p-type base region 5 in the vicinity of the side wall on the outer side of the coupled trench 2a, and gradually increase moving outward away from the side wall on the outer side of the coupled trench 2a. More specifically, the depth d11 of the emitter p-type region 65 may gradually increase outward from the side wall on the outer side of the coupled trench 2a as far as a predetermined position 67, and the depth d12 of the portion on the lower side of the LOCOS film 64 may be of the same extent as the depth d2 of the floating p-type region 9. The depth of the coupled trench 2a is, for example, of the same extent as the depth of the trench 2 of the active region 61. The emitter p-type region 65 is covered by the gate insulating film 3 and the LOCOS film 64, and the bridge portion 42d, and a portion 42e of approximately rectangular ring form on the outer side of the bridge portion 42d, of the second gate electrode 42 are provided on the gate insulating film 3 and the LOCOS film 64 respectively. The gate runner 63 is provided across the interlayer dielectric 8 on the portion 42e of approximately rectangular ring form outward of the bridge portion 42d of the second gate electrode 42. The second gate electrode 42 is connected to the gate runner 63 via a contact hole that penetrates the interlayer dielectric 8 in the depth direction.

Figure 30:
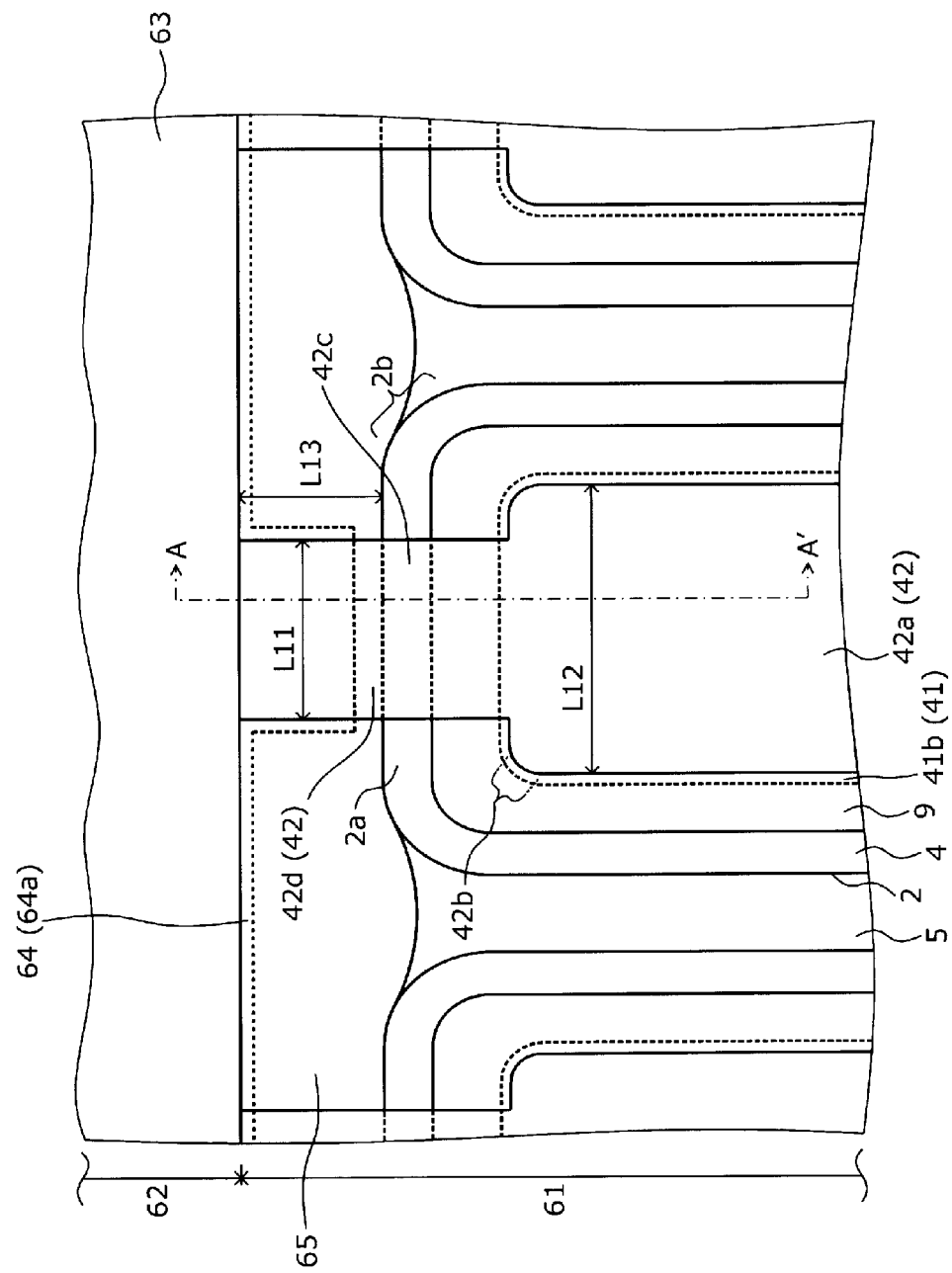
FIG. 30 is a plan view schematically showing another example of the vicinity of the edge termination structure portion of the semiconductor device according to the fourth embodiment.

A description will be given of another example of the configuration of the vicinity of the gate runner 63. FIG. 30 is a plan view schematically showing another example of the vicinity of the edge termination structure portion of the semiconductor device according to the fourth embodiment. The other example of the semiconductor device according to the fourth embodiment shown in FIG. 30 is such that the planar form of the LOCOS film 64 on the lower side of the gate runner 63 differs from that of the semiconductor device according to the fourth embodiment shown in FIG. 28. Specifically, as shown in FIG. 30, the LOCOS film 64 on the lower side of the gate runner 63 may be caused to partially (for example, in comb tooth form) project inward so as to also be disposed on the lower side of the bridge portion 42d of the second gate electrode 42. By so doing, the parasitic capacitance between the bridge portion 42d of the second gate electrode 42 and the substrate can be prevented from increasing. In FIG. 30, the outer periphery of the LOCOS film 64 on the lower side of the gate runner 63, and projecting from the gate runner 63 side to the lower side of the bridge portion 42d of the second gate electrode 42, is indicated by a broken line following the outer peripheries of the gate runner 63 and the bridge portion 42d of the second gate electrode 42.

According to the fourth embodiment, as heretofore described, a LOCOS film is provided distanced from a trench on a floating p-type region, and a second gate electrode distanced farther than the LOCOS film from the trench is provided on the LOCOS film, whereby the second gate electrode and LOCOS film can be formed in a step form wherein the number of steps is reduced toward the trench side. Therefore, the surface unevenness of an interlayer dielectric in an element structure portion can be reduced, and an intricate pattern can be formed. Also, by a side surface of the second gate electrode being of a tapered form that inclines in the same direction as an inclination of a LOCOS bird's beak and gently joins the inclination of the LOCOS bird's beak, the surface unevenness of the interlayer dielectric in the element structure portion can be further reduced. Also, as the second gate electrode is provided across the thick LOCOS film on the floating p-type region, controllability of the turn-on di/dt can be improved, and the mirror capacitance reduced, in the same way as in the first and second embodiments.

The embodiment can be changed in various ways, and in each embodiment, for example, the dimensions, surface concentration, and the like of each portion are variously set in accordance with the required specifications and the like. Also, in each embodiment, a first conductivity type is taken to be n-type and a second conductivity type p-type, but the embodiment is established in the same way when the first conductivity type is p-type and the second conductivity type n-type.

INDUSTRIAL APPLICABILITY

As heretofore described, the semiconductor device according to the embodiment is useful in a trench gate type power semiconductor device that includes a floating p-type region.

What is claimed is:
1. A semiconductor device, comprising:
a first semiconductor layer of a first-conductivity-type;
a second semiconductor layer of a second-conductivity-type selectively provided in one surface layer of the first semiconductor layer;
a third semiconductor layer of the first-conductivity-type selectively provided in an interior portion of the second semiconductor layer;
a trench that has inner walls and an interior portion, and that penetrates the second semiconductor layer and the third semiconductor layer to reach the first semiconductor layer;

a fourth semiconductor layer of the second-conductivity-type selectively provided in one surface layer of the first semiconductor layer and isolated from the second semiconductor layer by the trench;

an interlayer dielectric that covers the fourth semiconductor layer;

a fifth semiconductor layer of the second-conductivity-type provided in another surface layer of the first semiconductor layer;

a first electrode conductively connected to the second semiconductor layer and the third semiconductor layer and electrically isolated from the fourth semiconductor layer by the interlayer dielectric;

a second electrode conductively connected to the fifth semiconductor layer;

a gate insulating film provided along an inner wall of the trench within the interior portion of the trench;

a first gate electrode provided on an inner side of the gate insulating film within the interior portion of the trench;

a groove that is provided within a side of the fourth semiconductor layer that is near the interlayer dielectric and in a depth direction that is the same as that of the trench, that has an edge that is distanced from and disconnected from the trench, that has a depth that is less than that of the trench, and that has inner walls and an interior portion;

an insulation layer provided along an inner wall of the groove within the interior portion of the groove and covering the fourth semiconductor layer; and a second gate electrode provided on an inner side of the insulation layer within the interior portion of the groove and covering the insulation layer so that the first gate electrode and the second gate electrode are separated.

2. The semiconductor device according to claim 1, wherein the second semiconductor layer and the first electrode have an interface, and wherein the second gate electrode and the interlayer dielectric have an interface that has a height which is substantially equivalent to that of the interface of the second semiconductor layer and the first electrode.

3. The semiconductor device according to claim 2, wherein the insulation layer is a locally oxidized film.

4. The semiconductor device according to claim 1, wherein the trench and the groove are aligned in a direction, and wherein the first gate electrode and the second gate electrode are isolated from each other in the direction in which the trench and the groove are aligned.

5. The semiconductor device according to claim 4, wherein the insulation layer is a locally oxidized film.

6. The semiconductor device according to claim 1, wherein the insulation layer is a locally oxidized film.

7. A semiconductor device, comprising:
a first semiconductor layer of a first-conductivity-type;
a second semiconductor layer of a second-conductivity-type selectively provided in one surface layer of the first semiconductor layer;
a third semiconductor layer of the first-conductivity-type selectively provided in an interior portion of the second semiconductor layer;
a trench that has inner walls and an interior portion, and that penetrates the second semiconductor layer and the third semiconductor layer to reach the first semiconductor layer;
a fourth semiconductor layer of the second-conductivity-type selectively provided in one surface layer of the first semiconductor layer and isolated from the second semiconductor layer by the trench;
an interlayer dielectric that covers the fourth semiconductor layer;
a fifth semiconductor layer of the second-conductivity-type provided in another surface layer of the first semiconductor layer;
a first electrode conductively connected to the second semiconductor layer and third semiconductor layer and electrically isolated from the fourth semiconductor layer by the interlayer dielectric;
a second electrode conductively connected to the fifth semiconductor layer;
a gate insulating film provided along an inner wall of the trench within the interior portion of the trench;
a first gate electrode provided on an inner side of the gate insulating film within the interior portion of the trench;
an insulation layer provided, distanced from the trench, on the fourth semiconductor layer and covering the fourth semiconductor layer; and
a second gate electrode provided on the insulation layer at a distance that is farther from the trench than that of the insulation layer from the trench and covering the insulation layer,
wherein the insulation layer has a thickness, the insulation layer and the trench have an interval there between, and the interval between the insulation layer and the trench is equal to or greater than the thickness of the insulation layer, and
wherein the insulation layer has a thick portion and an end portion that has an inclination having a thickness which decreases nearing the trench, and the second gate electrode covers the thick portion of the insulation layer entirely but does not cover the end portion.

8. The semiconductor device according to claim 7, wherein the second gate electrode has an end portion that has a tapered form that inclines in a direction that is the same as that of the end portion of the insulation layer, and joins the inclination of the end portion of the insulation layer.

9. A semiconductor device, comprising:
a first semiconductor layer of a first-conductivity-type;
a second semiconductor layer of a second-conductivity-type selectively provided in one surface layer of the first semiconductor layer;
a third semiconductor layer of the first-conductivity-type selectively provided in an interior portion of the second semiconductor layer;
a trench that has inner walls and an interior portion, and that penetrates the second semiconductor layer and the third semiconductor layer to reach the first semiconductor layer;
a fourth semiconductor layer of the second-conductivity-type selectively provided in one surface layer of the first semiconductor layer and isolated from the second semiconductor layer by the trench;
an interlayer dielectric that covers the fourth semiconductor layer;
a fifth semiconductor layer of the second-conductivity-type provided in another surface layer of the first semiconductor layer;
a first electrode conductively connected to the second semiconductor layer and third semiconductor layer and electrically isolated from the fourth semiconductor layer by the interlayer dielectric;
a second electrode conductively connected to the fifth semiconductor layer;
a gate insulating film provided along an inner wall of the trench within the interior portion of the trench;

a first gate electrode provided on an inner side of the gate insulating film within the interior portion of the trench;
an insulation layer provided, distanced from the trench, on the fourth semiconductor layer and covering the fourth semiconductor layer; and
a second gate electrode provided on the insulation layer at a distance that is farther from the trench than that of the insulation layer from the trench and covering the insulation layer, wherein the insulation layer has a thick portion and an end portion that has an inclination having a thickness which decreases nearing the trench, and the second gate electrode covers the thick portion of the insulation layer entirely but does not cover the end portion.

10. The semiconductor device according to claim 9, wherein the second gate electrode has an end portion that has a tapered form that inclines in a direction that is the same as that of the end portion of the insulation layer, and joins the inclination of the end portion of the insulation layer.

11. A semiconductor device, comprising:
a first semiconductor layer of a first-conductivity-type;
a second semiconductor layer of a second-conductivity-type selectively provided in one surface layer of the first semiconductor layer;
a third semiconductor layer of the first-conductivity-type selectively provided in an interior portion of the second semiconductor layer;
a trench that has inner walls and an interior portion, and that penetrates the second semiconductor layer and the third semiconductor layer to reach the first semiconductor layer;
a fourth semiconductor layer of the second-conductivity-type selectively provided in one surface layer of the first semiconductor layer and isolated from the second semiconductor layer by the trench;
an interlayer dielectric that covers the fourth semiconductor layer;
a fifth semiconductor layer of the second-conductivity-type provided in another surface layer of the first semiconductor layer;
a first electrode conductively connected to the second semiconductor layer and the third semiconductor layer and electrically isolated from the fourth semiconductor layer by the interlayer dielectric;
a second electrode conductively connected to the fifth semiconductor layer;
a gate insulating film provided within the interior portion of the trench;
a first gate electrode provided on an inner side of the gate insulating film within the interior portion of the trench;
a groove that is provided within a side of the fourth semiconductor layer that is near the interlayer dielectric and in a depth direction that is the same as that of the trench, that has an edge that is distanced from and disconnected from the trench, that has a depth that is less than that of the trench, and that has inner walls and an interior portion;
an insulation layer provided along an inner wall of the groove within the interior portion of the groove and covering the fourth semiconductor layer; and
a second gate electrode provided on an inner side of the insulation layer within the interior portion of the groove and covering the insulation layer so that the first gate electrode and the second gate electrode are separated.

12. A semiconductor device, comprising:
a first semiconductor layer of a first-conductivity-type;
a second semiconductor layer of a second-conductivity-type selectively provided in one surface layer of the first semiconductor layer;
a third semiconductor layer of the first-conductivity-type selectively provided in an interior portion of the second semiconductor layer;
a trench that has inner walls and an interior portion, and that penetrates the second semiconductor layer and the third semiconductor layer to reach the first semiconductor layer;
a fourth semiconductor layer of the second-conductivity-type selectively provided in one surface layer of the first semiconductor layer and isolated from the second semiconductor layer by the trench;
an interlayer dielectric that covers the fourth semiconductor layer;
a fifth semiconductor layer of the second-conductivity-type provided in another surface layer of the first semiconductor layer;
a first electrode conductively connected to the second semiconductor layer and third semiconductor layer and electrically isolated from the fourth semiconductor layer by the interlayer dielectric;
a second electrode conductively connected to the fifth semiconductor layer;
a gate insulating film provided within the interior portion of the trench;
a first gate electrode provided on an inner side of the gate insulating film within the interior portion of the trench;
an insulation layer provided, distanced from the trench, on the fourth semiconductor layer and covering the fourth semiconductor layer; and
a second gate electrode provided on the insulation layer at a distance that is farther from the trench than that of the insulation layer from the trench and covering the insulation layer,
wherein the insulation layer has a thick portion and an end portion that has an inclination having a thickness which decreases nearing the trench, and the second gate electrode covers the thick portion of the insulation layer entirely but does not cover the end portion.

* * * * *